(12) United States Patent
Honan et al.

(10) Patent No.: US 12,727,092 B2
(45) **Date of Patent: *Sep. 1, 2026**

(54) TRANSPARENT ARTICLE WITH ELECTRICALLY-CONDUCTIVE PATTERN

(71) Applicant: Eastman Kodak Company, Rochester, NY (US)

(72) Inventors: James S. Honan, Spencerport, NY (US); Danielle A. Farmer, Rochester, NY (US); Kevin Edward Spaulding, Spencerport, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 236 days.

This patent is subject to a terminal disclaimer.

(21) Appl. No.: 18/532,021

(22) Filed: Dec. 7, 2023

(65) Prior Publication Data

US 2025/0040054 A1 Jan. 30, 2025

Related U.S. Application Data

(63) Continuation-in-part of application No. 18/359,097, filed on Jul. 26, 2023.

(51) Int. Cl.
*H05K 3/12* (2006.01)
*H05K 1/09* (2006.01)

(52) U.S. Cl.
CPC ................. *H05K 3/12* (2013.01); *H05K 1/09* (2013.01); *H05K 2201/0108* (2013.01); *H05K 2201/10151* (2013.01); *H05K 2203/06* (2013.01)

(58) Field of Classification Search
CPC ........ B32B 17/10935; B32B 17/10036; B32B 17/1022; B32B 17/10761;

(Continued)

(56) References Cited

U.S. PATENT DOCUMENTS 2,460,896 A 2/1949 Meyer et al.
4,946,733 A 8/1990 Seeger, Jr. et al.

(Continued)

FOREIGN PATENT DOCUMENTS

EP 1 024 683 A2 8/2000
EP 1 215 705 A2 6/2002

(Continued)

OTHER PUBLICATIONS

Girtan Mihaela et al., "A review on oxide/metal/oxide thin films on flexible substrates as electgrodes for organic and perovskite solar cells", Optical Materials, vol. 13, Jan. 1, 2022, p. 00122.

(Continued)

*Primary Examiner* — George R Koch
*Assistant Examiner* — Christopher C Caillouet
(74) *Attorney, Agent, or Firm* — J. Lanny Tucker

(57) ABSTRACT

A transparent article has a transparent laminating film; and an electrically-conductive, metal-containing pattern disposed over a surface of the transparent laminating film. The electrically-conductive, metal-containing pattern has a metallic pattern comprising a first surface facing the transparent laminating film and an opposing second surface. Such articles can be prepared using steps A) and B'), in order: A) providing a metallic pattern on a surface of a first substrate; and B') transferring the metallic pattern to a surface of a second substrate, thereby providing an electrically-conductive metal-containing pattern on the surface of the second substrate, wherein the second substrate is a transparent laminating film.

14 Claims, 17 Drawing Sheets

(58) Field of Classification Search

CPC ........ B32B 17/10045; B32B 17/10192; B32B 17/10275; B32B 2255/10; B32B 2255/28; B32B 17/10743; B32B 17/10788; B32B 27/08; B32B 27/30; B32B 27/306; B32B 27/308; B32B 2307/202; B32B 2307/412; B32B 2605/08; C23C 18/38; H01Q 1/1271; H01Q 1/276; H05K 3/12; H05K 3/187; H05K 3/24; H05K 2201/0108; H05K 2201/0326; H05K 2203/0709; H05K 2203/1545; H05K 3/048; H05K 3/22; H05K 3/241; H05K 3/4661; H05K 1/0306; H05K 1/09; H05K 1/092; H05K 3/046; H05K 3/181; H05K 3/20; H05K 2203/072; H05K 1/0274

See application file for complete search history.

(56) References Cited

U.S. PATENT DOCUMENTS 5,271,994 A 12/1993 Termath
6,241,382 B1 6/2001 Kieser et al.
7,386,936 B2 6/2008 Huhtasalo et al.
7,535,462 B2 5/2009 Spath et al.
7,842,156 B2 * 11/2010 Kline .................... H01Q 9/285 156/290
8,039,182 B2 10/2011 Sano et al.
8,133,412 B2 3/2012 Yamamoto et al.
8,709,288 B2 4/2014 Rouse et al.
9,374,907 B2 6/2016 Iftime et al.
9,743,516 B2 8/2017 Edd et al.
10,208,224 B2 2/2019 Song et al.
10,214,657 B2 2/2019 Shukla et al.
10,246,561 B1 4/2019 Shukla et al.
10,246,599 B2 4/2019 Chopra et al.
10,370,515 B2 8/2019 Shukla et al.
10,448,515 B2 10/2019 Johal et al.
10,472,528 B2 11/2019 Shukla et al.
10,479,902 B2 11/2019 Ogata et al.
10,524,356 B2 12/2019 Tombs
10,847,887 B2 11/2020 Tombs
10,851,257 B2 12/2020 Shukla
10,870,774 B2 12/2020 Shukla et al.
2003/0203101 A1 10/2003 Haubrich et al.
2004/0200061 A1 10/2004 Coleman et al.
2005/0153107 A1 7/2005 Iijima
2008/0137316 A1 6/2008 Khaselev et al.
2009/0071604 A1 3/2009 Moeyersons
2009/0140938 A1 6/2009 Ishibashi et al.
2011/0036493 A1 2/2011 Kawamura et al.
2011/0292511 A1 12/2011 Bentley
2015/0064426 A1 * 3/2015 Wang ................ H01B 13/0013 428/209
2018/0043608 A1 2/2018 Shinoda
2019/0136081 A1 5/2019 Shukla
2020/0092990 A1 * 3/2020 Hu ........................ H05K 3/207
2020/0163222 A1 5/2020 Kella et al.
2022/0371300 A1 * 11/2022 Chen ...................... B29C 48/07

FOREIGN PATENT DOCUMENTS

EP 0 963 146 B1 6/2006
EP 2 139 010 A1 12/2009
EP 2 682 949 B1 4/2016
JP 2005139546 A1 6/2005
JP 2009218368 A1 9/2009
JP 2009231426 A1 10/2009
JP 2010010179 A1 1/2010
WO 2005/056875 A2 6/2005
WO 2009/108758 A2 9/2009
WO 2012/140428 A1 10/2012

OTHER PUBLICATIONS

National Protective Security Authority (United Kingdom), "Introduction to Laminated Glass Interlayers" Jun. 2019, pp. 1-9, available on the internet at https://www.npsa.gov.uk/resources/introduction-laminated-glass-interlayers.

Toughglass, "PVB, SGP, EVA Interlayers. What Is the Difference," Aug. 14, 2019, pp. 1-6, available on the internet at https://www.toughglass.com.au/.

Wikipedia, "Laminated glass," pp. 1-8, available on the internet at https://en.wikipedia.org/wiki/Laminated_glass.

Wikipedia, "Composite glass," pp. 1-2, available on the internet at https://en.wikipedia.org/wiki/Composite_glass.

* cited by examiner 505
505
501
500
502

505
511
510
511
505
501
500
502

522
521
505
511
510
511
505
520
501
500
502

522
521
505
511
512
510
511
512
505
520

522
521
530
530
505
505
520
501
500
502

522
521
530
505
530
505
520

522
521
505
505
520

TRANSPARENT ARTICLE WITH ELECTRICALLY-CONDUCTIVE PATTERN

CROSS-REFERENCE TO RELATED APPLICATIONS

This patent application is a Continuation-in-part of copending and commonly assigned U.S. Publication No. 2025/0037900 filed Jul. 26, 2023 by Farmer et al., the disclosure of which is incorporated herein in its entirety by reference.

The present application is also related to copending and commonly assigned U.S. Publication No. 2025/0040056 filed on Jul. 26, 2023 by Farmer et al;

to copending and commonly assigned U.S. Publication No. 2025/0040055 filed on Jul. 26, 2023 by Honan et al;

to copending and commonly assigned U.S. Publication No. 2025/0040044 filed by Honan, Farmer, and Spaulding, on even date herewith and entitled "Article with Catalytic Ink and Electrically-conductive Pattern";

to copending and commonly assigned U.S. Publication No. 2025/0034345 filed by Honan, Farmer, and Spaulding, on even date herewith and entitled "Transparent Composite Article with Electrically-conductive Pattern"; and to copending and commonly assigned U.S. Publication No. 2025/0033327 filed by Honan, Farmer, and Spaulding, on even date herewith and entitled "Method of Making Transparent Composite Articles", the disclosures of all of which are incorporated herein in their entireties.

FIELD OF THE INVENTION

The present invention is directed to an article having a transparent substrate on which an electrically-conductive metal-containing pattern is disposed. In some embodiments, opposing surfaces of the electrically-conductive metal-containing pattern containing a metallic pattern can be darkened with appropriate darkening agents, to reduce metallic light reflectivity. In other article embodiments, such darkening is not necessary. This invention also relates to methods for making such articles.

BACKGROUND OF THE INVENTION

Articles having electrically-conductive metal-containing patterns provided on transparent substrates have been designed for various industrial and technical uses. For example, electrically-conductive articles have been designed for incorporation into touch screens for various digital communicative devices including computers, mobile phones, automatic teller machines, and other touch screen devices. In these devices, touch screen sensors detect the location of an object (for example a finger or stylus) touching a surface of a touch screen display or the location of an object positioned near the surface of a touch screen display.

Such displays require an electrode on the front surface of the display which must be substantially transparent in order not to block light transmission from the display and so to enable the display to carry out its intended function. Various electrically-conductive materials have been proposed for these electrodes to overcome various inherent or functional deficiencies.

An array or grid of fine electrically-conductive lines, wires, or tracks, electrically connected or not, forming an electrically-conductive mesh micropattern can be disposed on a surface of a suitable substrate to form a display electrode. Such electrically-conductive arrays or grids can be formed from metals, metallic alloys, or electrically-conductive polymers in ways known in the art.

In addition, mast or whip antennas mounted on the exterior of motorized vehicles, airplanes, ships, and other modes of transportation or formed on structures (such as windows) or helmets, for communication in receiving and transmitting electromagnetic signals (for example, radio waves) are steadily being replaced by thin-film antennas that can be formed using electrically-conductive metal-containing patterns. Such thin-film antennas present a number of advantages that are quite apparent to those skilled in the art and considerable research is on-going to improve their optical transparency, electrical conductivity, mounting means, transmitted and receiving modes, and other properties for their optimized use.

Thin-film antennas are being constructed using numerous technologies, each with various advantages and disadvantages. A major consideration when making such articles and using them in various modes is the optical transparency they exhibit when mounted or incorporated, but other factors can be important to meet the requirement of invisibility in their location of use.

There is a natural conflict between the properties of optical transparency and conductivity (or surface resistance) of electrically-conductive thin-film articles that are utilized to make thin-film antennas. For example, copper films having a surface resistance of about 0.25 milliohms/square (a) are commercially available, but their optical transparency is well below the desired level of at least 70%. Other commercially available electrically-conductive thin films containing ITO (indium tin oxide) or silver can have optical transparencies greater than 75% but they may have surface resistances in the range of 4-8 ohms/square which is several orders of magnitude greater than that of the copper films, and of known electrical conductors used in antenna construction. Higher surface resistance obviously results in lower antenna performance, such as reduced "antenna gain" by as much as 3-6 dB, depending upon the type of antenna.

U.S. Pat. Nos. 10,524,356 (Tombs) and 10,847,887 (Tombs) describe thin-film antennas disposed on transparent surfaces that are visually undetectable to a human observer. The transparent antennas described therein include an electrically-conductive material disposed on a surface of a non-opaque substrate and also have a geometry of conductive regions to define an antenna pattern. A non-electrically-conductive material can be disposed on the same surface in a fill pattern that is the inverse of the antenna pattern. An average optical transparency in conductive regions and the non-conductive regions of such articles is at least 50% and the average optical transparency in the conductive regions differs from that of the non-conductive regions by no more than 10%. These thin-film antennas and methods for making them represent a considerable improvement over the technologies known prior to the Tombs inventions.

One means for preparing electrically-conductive metal-containing patterns for use as thin-film antennas or electrodes in various devices includes electrolessly plating copper or other metallic materials onto transparent substrates. However, electroless plating of such metallic materials can be improved when the metallic materials are plated over "seed" metal particles (such as seed silver particles), as described for example in U.S. Pat. No. 10,870,774B2 (Shukla et al.) where silver nanoparticle seed particles are formed from the reduction of silver ion precursor materials.

However, when copper or other metallic materials are deposited electrolessly on a transparent substrate, whether using seed metal particles or not, to form a grid, array, or mesh of fine metal microwires, for example to make electrically-conductive antenna, the copper or other metallic deposit can grow both vertically and laterally. When viewed through a transparent substrate, the lateral overgrowth is visible (for example, from reflection of light). When a "darkening agent" (or a "reflection reduction agent") is applied to the copper or other metallic pattern, it is observed that only the outer surface of the viewable copper or other metallic pattern is darkened. The surface of the lateral overgrowth in contact with the transparent substrate is not contacted by the darkening agent and is therefore not darkened as one would desire. The non-darkened copper or other metallic material in the electrically-conductive metal-containing pattern is therefore visibly light-reflective when viewed through the transparent substrate.

Various researchers have been investigating ways to address this problem but with limited success. For example, U.S. Patent Application Publication 2004/0200061 (Coleman et al.) describes a method of selectively electrolessly plating the top portions of a substrate corresponding to a metallic pattern and separating the metallic pattern from the substrate. In some embodiments, an electrically-conductive ink may be selectively placed on the substrate to facilitate plating of a desired electrically-conductive pattern or to facilitate separation of that pattern from the substrate.

U.S. Patent Application Publication 2020/0163222A1 (Kella et al.) relates to a complicated method for forming a pattern of a material on a substrate. This method comprises providing a continuous material layer of dry particles; jetting adhesive to form an adhesive layer on the layer of particles, wherein either the material layer of dry particles or the adhesive layer is formed in a pattern corresponding to the pattern of material to be formed on the substrate; consolidating the material layer using heat and pressure; and transferring the material layer to the substrate with the adhesive layer fixing the material layer to a surface of the substrate. Such methods are time consuming, expensive, prone to operator errors, and require elaborate manufacturing protocols and facilities.

While these and other known methods describe means for transfer of an electrically-conductive pattern for enabling the formation of that pattern, the known methods fail to describe or teach how to reduce the light reflectivity of electrically-conductive metal-containing patterns that are intended for use where light reflection is highly undesirable, such as in thin-film antenna mounted on a vehicle, airplane, window, or on another device where antenna noticeability must be very low.

Incorporation of electrically-conductive metal patterns into window glass used in vehicles, airplanes, windows is challenging due to the need to precisely place the patterns for connection to controller electronics and they limit visibility. Automobile glass, for instance, is typically prepared by laminating two thin sheets of glass with one or more layers of a lamination interlayer film, typically a poly(vinyl butyral) (PVB) film to make a composite structure (or composite article) of glass sheet, polymer film, and glass sheet. The electrically-conductive metal pattern is provided on a substrate, typically poly(ethylene terephthalate) (PET), cut to a size just larger than the electrically-conductive metal pattern. After incorporation, the PET substrate edges can be visible due to the refractive index mismatch of the PET with the PVB and also due to air bubbles that collect at the edges of the PET during lamination that would normally be evacuated.

Thus, there remains a need for articles having electrically-conductive metal-containing patterns (or conductive "mesh") on thin film substrates such as glass and transparent polymeric films, which have low visible light-reflectivity (or high optical transparency) when viewed from either above the electrically-conductive metal pattern down to the transparent substrate or when viewed through that transparent substrate to the underside of the electrically-conductive metal pattern. Moreover, there is a need for reducing the visibility of the substrate of electrically-conductive metal patterns when incorporated into composite articles. There is also a need to simplify the placement of the electrically-conductive metal patterns for electrical connections, and to do this in an efficient manner.

U.S. Pat. No. 5,271,994 (Termath) describes an electrically eatable laminated glazing system comprising two panes of glass bonded together by a thermoplastic film of poly(vinyl butyral). Polymeric ionomer layers are described for a similar use in U.S. Patent Application Publication 2009/0071604 (Moeyersons).

While the inventive articles and methods for making them described in the U.S. Ser. Nos. 18/359,077, 18/359,097, and 18/359,125, identified above, provide important and significant advances in the art relating to electrically-conductive metal-containing patterns useful as antenna in various products, there continues to be a need for alternative and simpler articles that can be adapted for the same purposes that may not require darkening of metallic patterns.

SUMMARY OF THE INVENTION

The present invention provides an article comprising: a transparent laminating film; and an electrically-conductive, metal-containing pattern disposed over a surface of the transparent laminating film, wherein the electrically-conductive, metal-containing pattern comprises a metallic pattern comprising a first surface facing the transparent laminating film and an opposing second surface.

This invention further provides a method for providing an article comprising an electrically-conductive metal-containing pattern, the method comprising steps A) and B'), in order:

A) providing a metallic pattern on a surface of a first substrate; and

B') transferring the metallic pattern to a surface of a second substrate thereby providing an electrically-conductive metal-containing pattern on the surface of the second substrate, wherein the second substrate is a transparent laminating film.

The present invention provides a number of advantages. For example, visibility due to refractive index mismatch or entrapped air in composite articles is reduced or eliminated because the first substrate is not present in the composite article. Registration of the electrically-conductive metal patterns can be improved when the electrically-conductive metal pattern is transferred to a transparent polymeric film (also known as an interlayer described below) of dimensions about the same as those of the final composite article. The electrically-conductive metal patterns can be produced efficiently and compactly on the first substrate, but then they can be transferred to the transparent polymeric film in desired locations.

Figure 1:
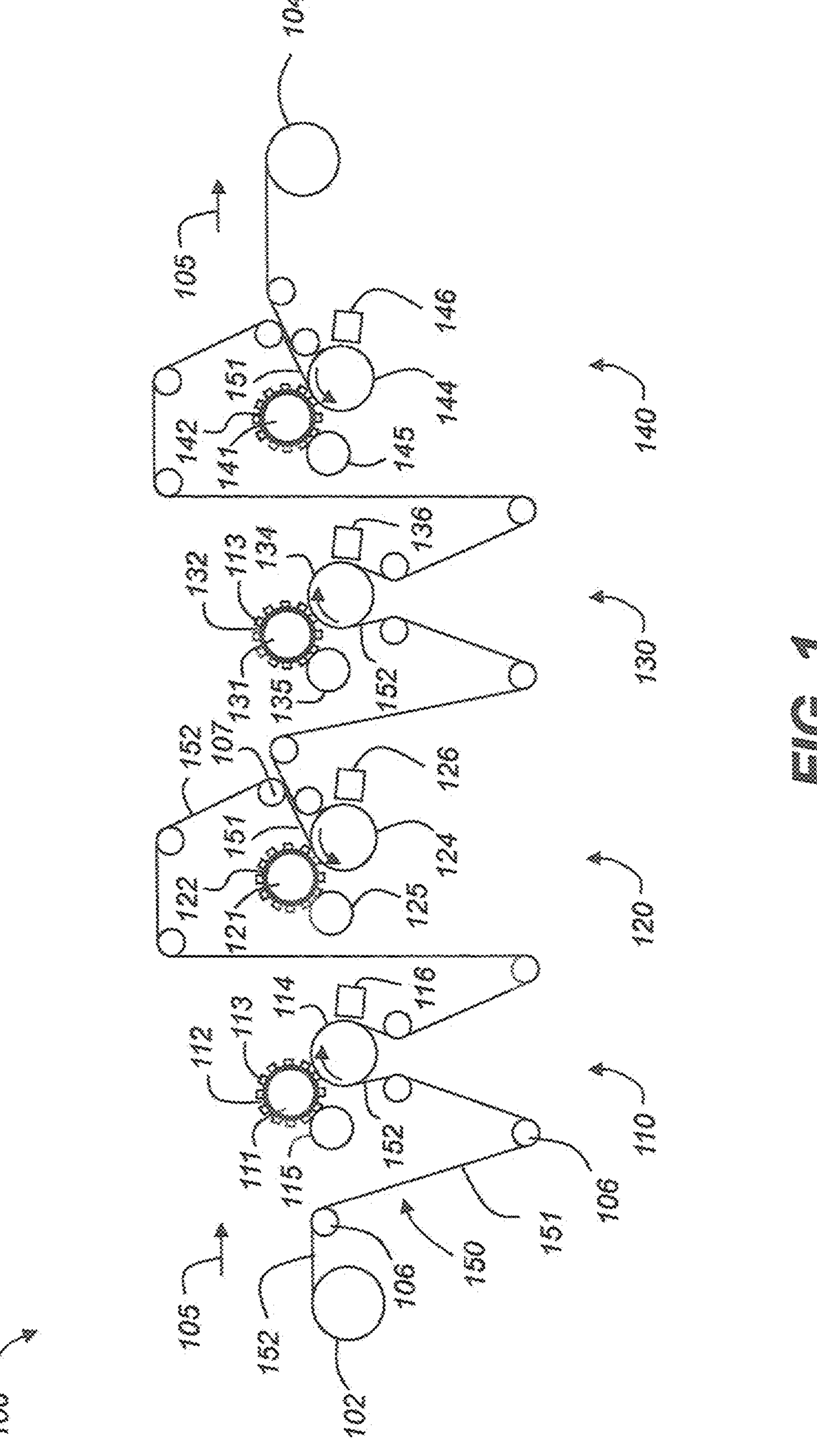
FIG. 1 is a schematic side view of a flexographic printing system for roll-to-roll flexographic printing of a curable catalytic ink on both sides of a substrate.

It is to be understood that the attached drawings are for purposes of illustrating the concepts of the present invention and may not be to scale for the sake of clarity. Identical reference numerals have been used, where possible, to designate identical features that are common to the drawings. One of ordinary skill in the art will be able to readily determine the specific size and interconnections of the elements of the particular embodiments of the present invention.

DETAILED DESCRIPTION OF THE INVENTION

Definitions

The following discussion is directed in particular to various embodiments of the present invention and the components, materials, features, or method steps comprising those embodiments, and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described for any specific embodiment.

As used herein to define various materials, features, and components, used in the methods and articles (including composite articles) according to the present invention, unless otherwise indicated, the singular forms "a," "an," and "the" are intended to include one or more of the components (that is, including plurality referents) and thus are not intended to limit the scope of the present invention.

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The present invention is inclusive of combinations of the embodiments described herein. References to "a particular embodiment" and the like refer to features that are present in at least one embodiment of the present invention. Separate references to "an embodiment" or "particular embodiments" do not necessarily refer to the same embodiment or embodiments; however, such embodiments are not mutually exclusive, unless so indicated or as are readily apparent to one of skill in the art. It should be noted that, unless otherwise explicitly noted or required by context, the word "or" is used in this disclosure in a non-exclusive sense.

The use of numerical values in the various ranges specified herein, unless otherwise expressly indicated otherwise, are considered as approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

References to "upstream" and "downstream" herein refer to direction of flow. Web media or continuous web moves along a path in a web advance direction from upstream to downstream. Similarly, fluids or liquid compositions flow in a direction from upstream to downstream. In some instances, a fluid or liquid composition can flow in an opposite direction from the web advance direction. For clarification herein, upstream and downstream are meant to refer to a web motion unless otherwise noted.

The L* value used herein to describe darkened and undarkened metallic patterns or surfaces is a measure of "lightness" used in the CIELAB color space wherein the measured unit value of "0" is typically black in color and a measured unit value of "100" is typically white in color. This parameter is calculated using the cube root of the relative luminance with an offset near black, and was established by the International Commission on Illumination (CIE) in 1976. CIELAB values (that is, L*, a* and b* values) are generally measured using a color measurement device such as a spectroradiometer, spectrophotometer or colorimeter as an integrated average value over an area of a surface defined by an aperture. The CIELAB values are typically measured relative to a reference white surface illuminated by a reference illuminant such as a Standard Illuminant D65. In an exemplary embodiment, CIELAB values can be measured using a HunterLab UltraScan Spectrophotometer.

The C* value used herein to describe darkened and undarkened metallic patterns is a measure of "chroma" in the CIELAB color space. A C* value of zero corresponds to a neutral color (for example, a gray color), with larger values of C* corresponding to more colorful colors. The C* value is calculated from the CIELAB a* and b* values using the equation $C^*=(a+^2+b^{*2})^{0.5}$.

As used herein, the term "transparent" refers to a material having an optical transmittance (or transmission), optical transparency, or opacity of ambient light of at least 80%, or even of at least 90%, or more likely of at least 95%, as measured using a conventional spectrophotometer such as a HunterLab UltraScan VIS Spectrophotometer, manufactured by Hunter Associates Laboratory, Inc. (Reston, VA).

The optical density is then calculated by comparing the light intensity (I) that passes through to the light intensity (IO) that reaches the optical photometer when no article or layer is present, and using the equation: −log 10 (I/IO).

For reflection color measurements of fine mesh patterns, the HunterLab UltraScan VIS Spectrophotometer (noted above) also can be used. The use of a light trap behind the sample can be employed to enable measurement of light being reflected by the surface of the electrically-conductive metal pattern without confounding by the light reflected by the typical use of a white background.

Unless otherwise indicated herein, the terms “electrically-conductive” and “electrical conductivity” refer to a material, layer, or pattern having a sheet resistance of less than 100 ohms per square, or less than 10 ohms per square, or even less than 1 ohm per square as measured using a Keithley Multimeter, determining sheet resistance according to well-known Smits or van der Pauw methodologies.

Unless otherwise indicated, the term “weight %” refers to the amount of a component or material based on the total amount of the composition, mixture, or solution being considered.

Unless otherwise indicated, the term “non-aqueous” as applied to non-aqueous silver ion-containing precursor compositions and non-aqueous silver nanoparticle-containing compositions means that the solvent media used to form such compositions are predominantly organic in nature and water is not purposely added but may be present in an amount of less than 5 weight % of the total weight of all solvents in the composition.

Average dry thickness of metal-containing lines, grid lines, or other metallic pattern features described herein can be the average of at least 2 separate measurements taken, for example, using electron microscopy, optical microscopy, or profilometry, all of which should provide substantially the same results for a given test sample.

Uses

The methods of the present invention can be used to prepare articles of the present invention that can be incorporated into electrodes for example, in membrane touch switches, battery testers, biomedical and electroluminescent lamps, radio frequency identified devices (RFID) or antenna, flat panel displays such as plasma display panel (PDP) and organic light emitting diode (OLED) displays, printed transistors, and thin film photovoltaics. The present invention is particularly useful for providing thin film antennas for use in or on various devices where it is desired that the thin film antennas are unobservable under most circumstances, for example in composite articles of the present invention that can be designed as antennae-containing windshields for moving vehicles, internal and exterior windows and glass partitions, helmet visors, and other objects having rigid transmissive glass-like structure.

Articles of the Present Invention

Articles and composite articles of the present invention, as described in the disclosure provided herein and as illustrated particularly in the accompanying FIGS. 10A-10D and FIGS. 11A and 11B have numerous uses as described above, and can be quite simple in structure. In general, they comprise a transparent polymeric film which, in some embodiments, is known as a laminating film, laminating interlayer, or “adhesive layer,” that can be used to adhere or bond two panes, sheets, or rigid substrates comprised of a transparent glass, polycarbonate, or other transparent glass-like material, together to form a composite article of the present invention.

The articles (or laminating films) of the present invention, and the composite articles of the present invention, can have an opacity or optical transparency measured as described above, of at least 50%, or more likely of at least 70%.

The articles or laminating films of the present invention are generally quite thin, flexible, optically clear (transparent), and stretchable to some degree. Their dry thickness is typically at least 0.2 mm and up to and including 10 mm. They can be composed of any suitable material that satisfies the conditions and properties described herein, but they are particularly composed of one or more of the following polymeric materials: poly(vinyl butyral) (or PVB) for example, marketed as SAFLEX® film by Eastman Chemicals Company and marketed as TROSIFOL® and BUTACITE® films by Kuraray; poly(ethylene vinyl acetate) (or EVA) for example, marketed as EVASAFE by Bridgestone; polyacrylates and poly(methyl methacrylates); polyurethanes; and ionomeric polymers marketed for example, as SENTRYGLAS® (or SPG) by Kuraray. Laminating films composed of poly(vinyl butyral) are particularly useful in the practice of this invention.

Such articles (or laminating films) can be in any suitable shape or form as long as each comprises first and second opposing surfaces. Thus, such films can be in the form of sheets or of continuous films, webs, or strips of polymer in roll or unrolled form, and are typically transparent (with an optical transmittance of at least 50%). The opposing surfaces of such articles need not be perfectly planar or flat but can have some curvature or surface irregularities (such as indentations and ridges) as long as their purpose is not adversely affected.

Disposed over a surface (such as the first opposing surface) of the transparent polymeric film (or laminating film) is one or more (for example, two or more) electrically-conductive, metal-containing patterns. In general, each electrically-conductive, metal-containing pattern comprises: a metallic pattern having a first surface facing the transparent polymeric film and an opposing second surface; and in many but not all embodiments, a pattern of a catalytic ink disposed over at least a portion of the second surface of the metallic pattern. The pattern of the catalytic ink and the metallic pattern can be the same or different for any plurality of electrically-conductive, metal-containing patterns in an article of the present invention. Thus, the two or more metallic patterns can comprise the same or different plurality of features that can be spaced apart or connected.

The composite articles of the present invention are similarly constructed but the article (or laminating film) comprising the transparent polymeric film with the electrically-conductive metal-containing pattern disposed thereon is sandwiched between two panes (or sheets or substrates) of a suitable transparent rigid material including but not limited to rigid materials comprising a glass (typically silicate-containing in chemical composition), a polycarbonate, or an acrylic resin (such as plexiglass), whereby the transparent polymeric film (with an electrically-conductive metal-containing pattern disposed thereon) can serve as a transparent laminating film to adhere the two panes or sheets of transparent rigid substrates. A composite article of the present invention can further comprise a second transparent polymeric film that can be the same as or different from the “first” transparent polymeric film, which is sandwiched between one of the two described panes (or sheets) of transparent rigid substrates and a third pane (or sheet) of yet another rigid substrate such as a pane of glass, thereby to serve as a “second” transparent laminating film in the resulting composite articles. This second transparent laminating film can also have an electrically-conductive, metal-containing pattern disposed thereon, or such electrically-conductive, metal-containing pattern can be absent. As one of ordinary skill in the art would appreciate, such composite article can comprise further "sandwiched" transparent laminating films and successive panes (or sheets) of transparent rigid substrates.

Where two or more of the same or different electrically-conductive metal-containing patterns are present, each of such patterns can be sandwiched between the same two panes of transparent rigid substrates such as two panes of a glass. Further details of embodiments of the composite articles according to the present invention are described below in relation to FIGS. 11A and 11B.

Figure 7:
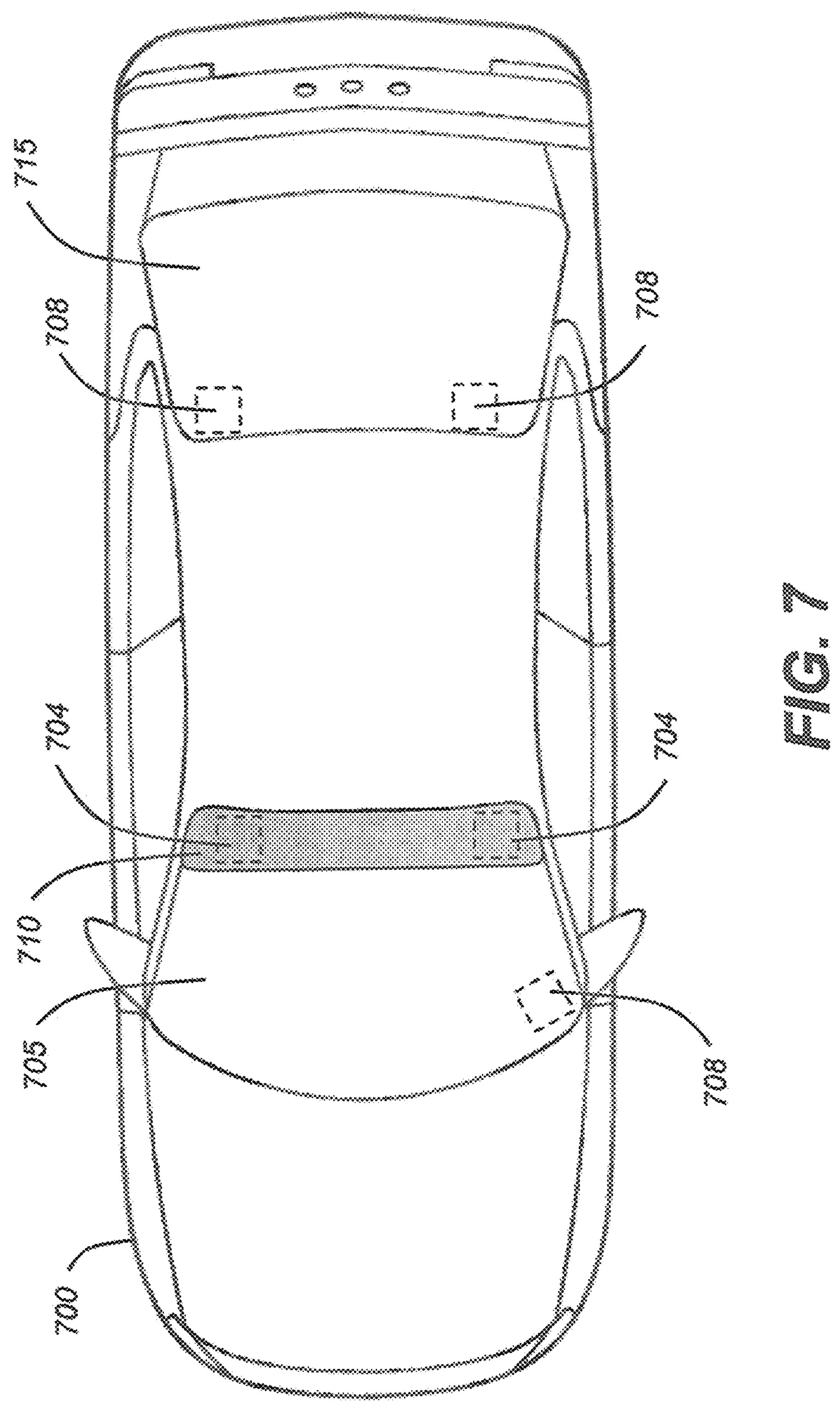
FIG. 7 illustrates composite articles of the present invention that are designed for use as transparent antennas incorporated into various windows of an automobile or another vehicle.
Figure 9:
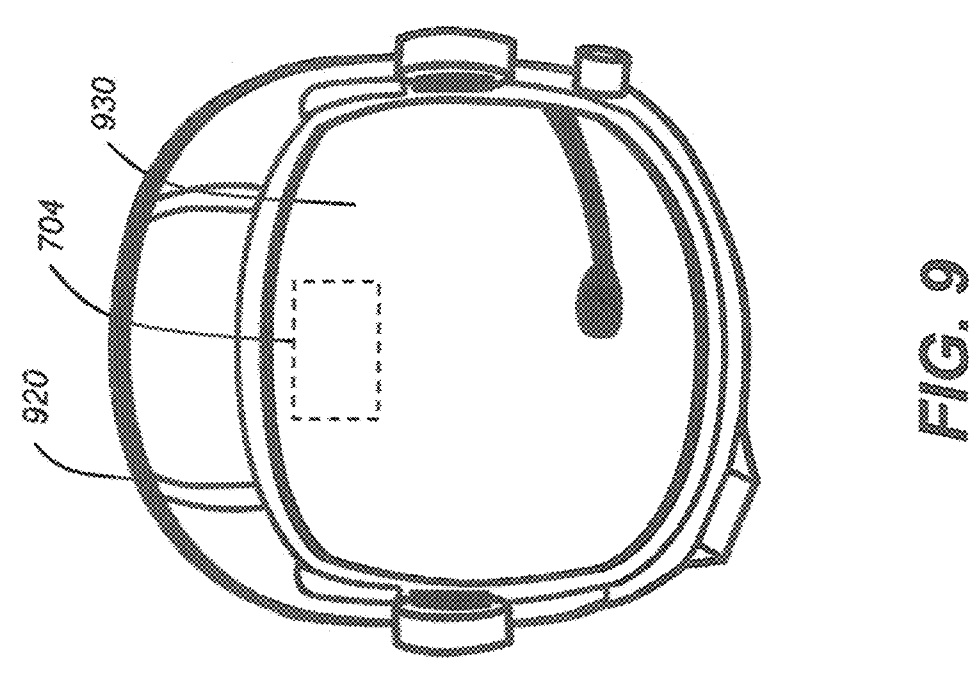
FIG. 9 illustrates a composite article of the present invention that is designed for use as a transparent antenna incorporated into a helmet visor.
Figure 8:
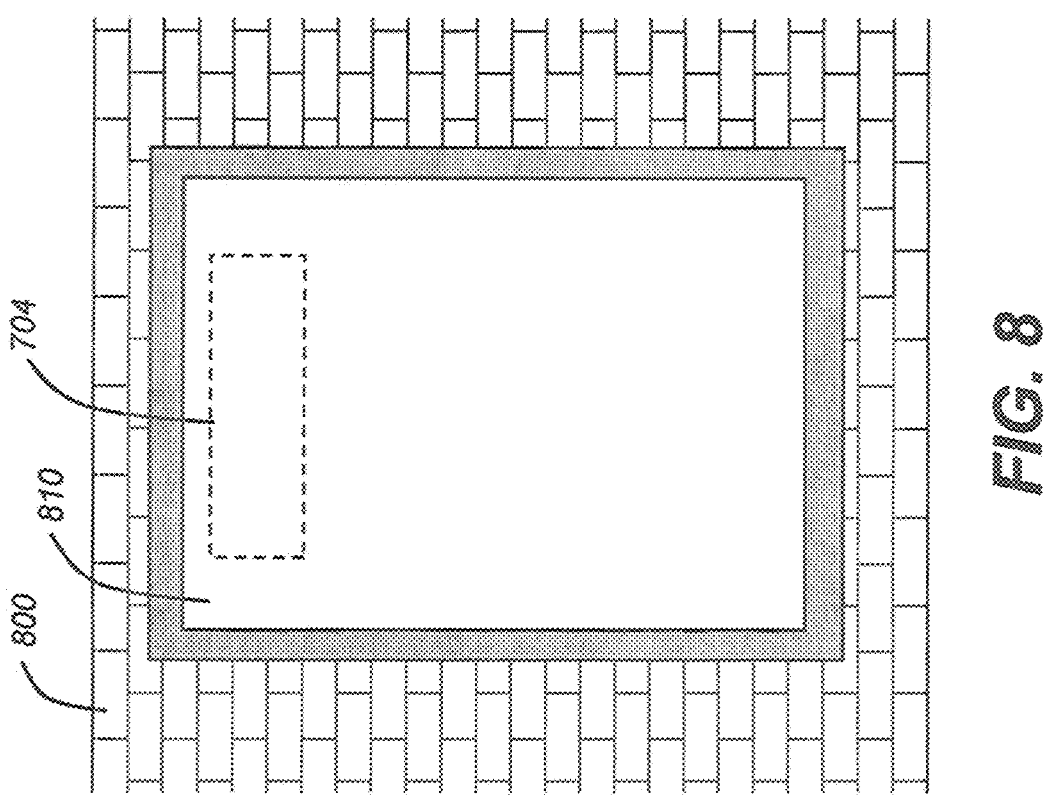
FIG. 8 illustrates a composite article of the present invention that is designed for use as a transparent antenna incorporated into the window of a building.

Such a composite article according to the present invention can be designed to serve as a vehicle windshield comprising one or more antennae (as illustrated for example, in FIG. 7). Other potential uses of the articles including composite articles of the present invention are illustrated in FIGS. 8 and 9, but other uses are widely known in the art and would be readily accomplished by one of ordinary skill in the art using the teaching provided herein.

Methods of Providing Articles According to the Present Invention

Methods according to the present invention are designed to provide an article according to the present invention (including the composite articles) that comprises an electrically-conductive metal-containing pattern, or a plurality of two or more of the same or different electrically-conductive metal-containing patterns disposed over a surface of a transparent polymeric film (or laminating film).

In simple form, a method of this invention generally comprises the essential steps A) and B') that are described below in detail, and these steps are generally carried out in the noted alphabetical order. There may be, however, intermediate steps carried out between any two of the identified steps, as one skilled in the art could perceive to be helpful. A more specific method of the present invention comprises the essential steps A-1), A-2), and A-3) collectively to accomplish step A), and these steps are generally carried out in the noted alphabetical order. In other methods of the present invention, step C) can be carried out after steps A) and B') to provide a composite article of the present invention.

Figure 3:
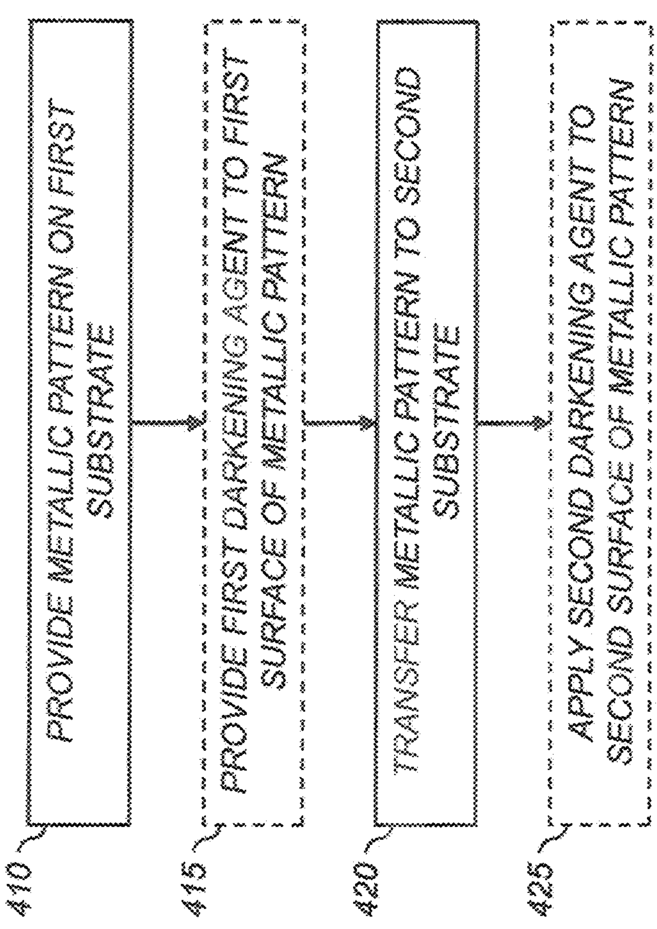
FIG. 3 is a flow diagram of the steps in a method useful to make articles with electrically-conductive, metal-containing patterns, with and without darkening steps.

A generic method is illustrated in the flow diagram of FIG. 3 in which step A) is represented by a provide metallic pattern on first substrate step 410 in which a metallic pattern is provided on a surface of a first substrate; step B) is represented by providing first darkening agent to first surface of metallic pattern step 415 in which a first darkening agent is applied to a first surface of the metallic pattern formed in provide metallic pattern on first substrate step 410 to form a first darkened surface; step C) is represented by transfer metallic pattern to second substrate step 420 in which the metallic pattern formed in provide metallic pattern on first substrate step 410 with the first darkened surface is transferred to a surface of a second substrate so that the first darkened surface is in direct contact with the second substrate surface; and step D) is represented by apply second darkening agent to second surface of metallic pattern step 425 in which a second darkening agent (same as or different from the first darkening agent) is applied to a second (undarkened) surface of the metallic pattern transferred in transfer metallic pattern to second substrate step 420 to form a second darkened surface the transferred metallic pattern.

In some embodiments, the darkening of the metallic patterns may not be a necessary or desirable feature for one or both surfaces of the pattern. Therefore, the apply first darkening agent to first surface of metallic pattern step 415 and the apply second darkening agent to second surface of metallic pattern step 425 in FIG. 3 are optional steps as indicated by the dashed border of these steps in the figure. In such embodiments, the transfer of the metallic pattern to a second substrate having desirable characteristics for a particular application provides important advantages even without the darkening steps.

An alternative more specific method is illustrated in the flow diagram of FIG. 5 in which step A-1) is represented by provide catalytic ink pattern on first substrate step 400 in which a catalytic ink pattern is provided on a surface of a first substrate; step A-2) is represented by cure catalytic ink pattern step 402 in which the provided catalytic ink pattern is cured in a suitable fashion as described in more detail below; and step A-3) is represented by form metallic pattern on cured catalytic ink pattern step 405 in which a metallic pattern is formed on the cured catalytic ink pattern, for example, by electroless plating a metal on the cured catalytic ink pattern. Step B) is then carried out as described above to provide a darkened first surface of the metallic pattern by providing first darkening agent to first surface of metallic pattern step 415 in FIG. 5. The metallic pattern and optionally the catalytic ink pattern can then be transferred to a surface of the second substrate as referenced as transfer metallic pattern to second substrate step 420 in FIG. 5. A second darkening agent is then applied to the undarkened surface of the transferred metallic pattern in step D) as referenced as apply second darkening agent to second surface of metallic pattern step 425 in FIG. 5. The catalytic ink pattern may also be transferred in this embodiment if desired as described below.

In some embodiments, the darkening of the metallic patterns may not be a necessary or desirable feature for one or both surfaces of the pattern. Therefore, the apply first darkening agent to first surface of metallic pattern step 415 and the apply second darkening agent to second surface of metallic pattern step 425 in FIG. 5 are optional steps as indicated by the dashed border of these steps in the figure. In such embodiments, the transfer of the metallic pattern to a second substrate having desirable characteristics for a particular application provides important advantages even without the darkening steps.

Thus, the method of the present invention firstly includes A) providing an electrically-conductive metallic pattern on a surface of a first substrate. The form and composition of the first substrate [as well as a second substrate used in operation of step B')] are described below for all embodiments of the present invention.

Such an electrically-conductive metallic pattern can be provided in a variety of ways, and can comprise a number of pure metals or metallic alloys that have a measurable amount of electrical conductivity as described above. Some metallic materials that meet this requirement include, but are not limited to, silver, copper, gold, aluminum, tungsten, zinc, nickel, iron, platinum palladium, and tin metals, as well as alloys of two or more of these metals. Examples of alloys useful in this invention include brass, bronze, steel. These metals or metallic alloys can be in the form of particles, fibers, filaments, layers, sheets, or other forms that would be readily apparent to one skilled in the art. Examples of ways that the electrically-conductive metal pattern can be provided is to directly print an electrically-conductive ink such as an ink containing metallic nanoparticles, (for example, PFI-722 SILVER Nanoparticle Ink available from Novacentrix of Austin, TX, or 125-28 Silver Ink available from Creative Materials Inc. of Ayers, MA), or to use an imprint and fill process such as that described in commonly-assigned U.S. Pat. No. 7,051,429 (Kerr et al.), the disclosure of which is incorporated herein by reference. A particularly useful means for providing an electrically-conductive metal is electroless plating that is discussed in more detail below.

Figure 2:
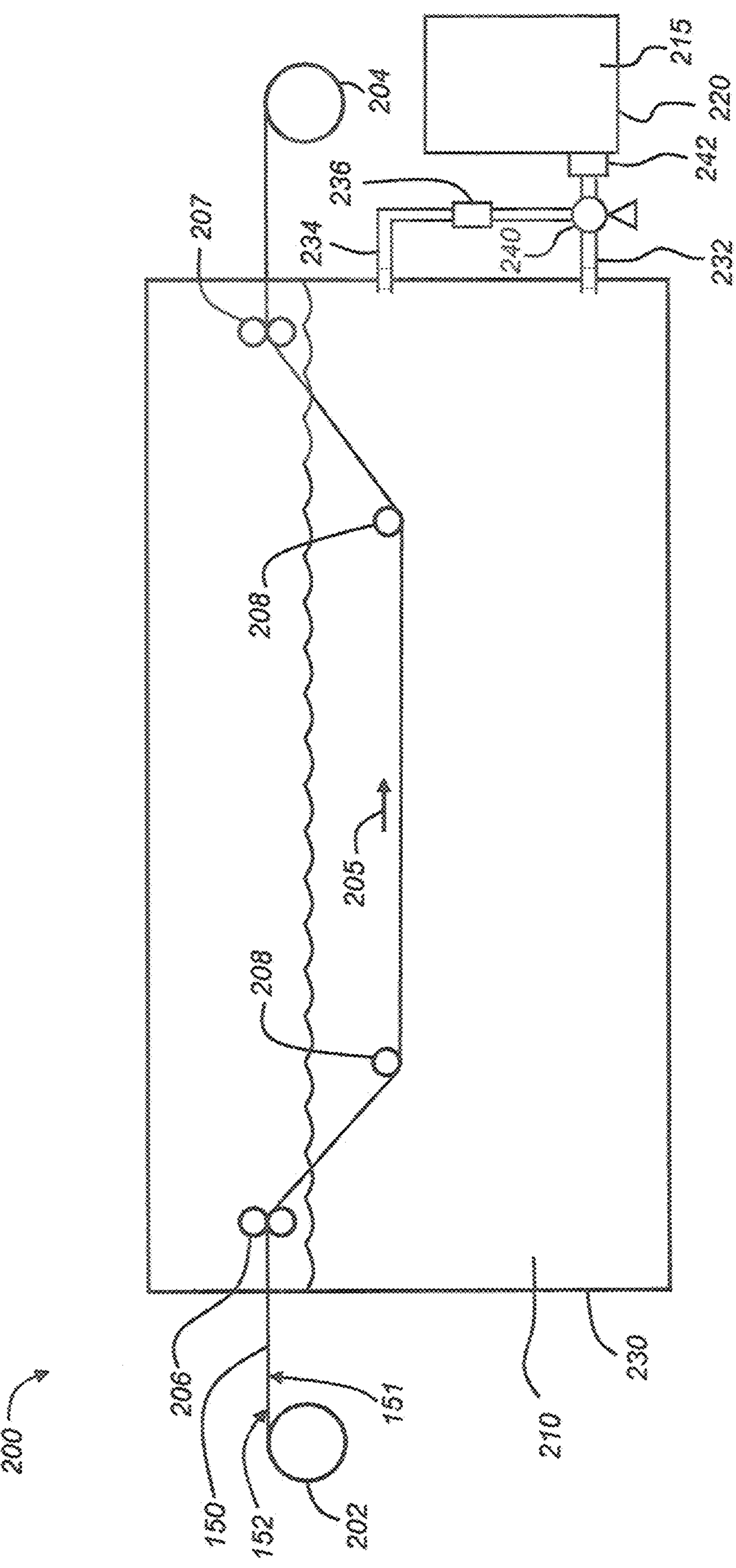
FIG. 2 is a schematic side view of a roll-to-roll metal electroless plating system.

Copper and copper alloys are particularly useful electrically-conductive materials for use in forming metallic patterns according to the present invention due to its high conductivity. It can be readily provided on a first substrate using conventional electroless plating as illustrated in FIG. 2. However, copper and other electrically-conductive metallic materials described above can be disposed onto the surface of the first substrate using other known means including metal sputtering, vacuum deposition, flexographic printing, screen printing, gravure printing, and inkjet printing, but the electrolessly plating technology is most desirable.

One means for providing metallic patterns on the surface of the first substrate is described in U.S. Pat. No. 9,743,516B2 (Edd et al.), the disclosure of which is incorporated herein by reference. In this technology, a thin film or pattern of a thin film precursor material such as an oxide, salt, or organometallic form of a metal such as copper is applied to the first substrate surface by a vacuum deposition technique, evaporation, or sputtering, or by use of electrostatic deposition, xerography, or flexography. The thin film precursor material is then "cured" chemically or photonically to provide the pure metal or pure metal alloy on the substrate surface, desirably in a pattern-wise manner. The result is a metallic pattern according to operation or step A) that can then be subjected to the steps B') and C) described below.

Alternatively, it can be advantageous to form one or more of the same or different metallic patterns using "seed" metallic particles for electrolessly plating of copper or of other metals. Such seed metallic particles can be provided in various ways known in the art.

For example, they can be provided as a component of a metal-containing or metal-forming "catalytic ink" that is disposed in pattern-wise fashion to form a pattern of a catalytic ink on the surface of the first substrate, for example by using some form of printing with a printing means such as a flexographic printing plate. A common source of such seed particles are silver nanoparticle-containing catalytic inks, or silver ion-containing catalytic inks in which the silver ions can be reduced to form silver nanoparticles. Copper ion-containing catalytic inks are also useful. Such catalytic inks can be typically applied in non-aqueous liquid composition using flexographic printing, screen printing, or other suitable printing methods, followed by heating, curing, or other operations to provide the pattern of a catalytic ink on which a metallic pattern can be formed. As used herein, the term "catalytic" means that the applied formulation facilitates electroless plating by providing initiation sites for reducing metal ions [for example, copper (+2) ions or silver (+1) ions] to copper or silver metal (0). A "catalytic ink" can be chemically or physically changed in some manner, such as being hardened or crosslinked, using exposure to chemistry or radiation (for example, UV or actinic radiation), and comprises catalysts that facilitate the reduction of metal ions [for example, copper (+2) ions or silver (+1) ions] to copper or silver metal (0).

While silver is an ideal electrical conductor and has a wide range of industrial, medical, and consumer uses, silver metal has become particularly useful to facilitate electrolessly plating of copper and other electrically-conductive metals to form metallic patterns that are highly electrically-conductive according to the present invention. For example, the silver seed particles can be provided in curable catalytic inks containing silver salts or organosilver compounds in which the silver ions can be chemically reduced using an appropriate reducing agent to provide nanoparticles of silver metal. Representative silver ion-containing compositions that are useful in catalytic inks are described in U.S. Patent Application Publication 2015/0107474 A1, (Ramakrishnan), U.S. Pat. No. 9,511,582 B2 (Jin et al.), U.S. Pat. No. 10,870,774B2 (Shukla et al.), the disclosures of all of which are incorporated herein by reference.

The useful catalytic inks can be composed of various materials that allow chemical catalysis [for example, reduction of silver (+1) to silver metal] to occur. Catalytic inks of this type known in the art, many of which can include metallic nanoparticles, which can be used to provide seed metallic particles in a pattern comprised of electrically-conductive dots, wires, grids, grooves, or fine lines of any geometric arrangement of a plurality of these and other features that can be spaced apart of connected. These plurality of features can be the same or different for each metallic pattern formed in A) according to the present invention, and thus each article formed according to the present invention also can have a plurality of electrically-conductive metal-containing patterns having features that can be spaced apart or connected, and which features can be the same or different for each metallic pattern thus formed.

Some metal-containing catalytic inks are considered "non-aqueous silver precursor compositions" comprising silver (+1) salts or copper (+2) salts containing reducible silver or copper ions, suitable reducing agents (for example, cellulosic polymers or other known metal ion reducing agents), non-aqueous solvents, and other addenda known in the art.

A useful catalytic ink can be formulated as non-aqueous silver-containing precursor composition as described for example in U.S. Pat. No. 10,870,774B2 (noted above) and that is a silver- and copper-containing precursor composition described for example in U.S. Pat. No. 10,851,257B2 (Shukla), the disclosures of both of which are incorporated herein by reference in their entirety. Such catalytic inks can be used to provide metallic materials, for example, silver nanoparticles or copper nanoparticles from reducible forms of silver ions or copper ions, respectively, and the resulting metal nanoparticles generally can have a mean particle size of at least 25 nm and up to and including 750 nm. Such catalytic ink formulations also can comprise suitable polymeric materials (such as cellulosic materials and vinyl acetals), one or more non-aqueous solvents, catalytically reactive materials such as ethylenically unsaturated polymerizable monomers (such as diacrylates and dimethacrylates), metal particle dispersing compounds, and other addenda including but not limited to, carbon black.

Examples of other metal-containing catalytic inks and precursor compounds used for their preparation are described in numerous publications, including but not limited to, U.S. Pat. No. 9,155,201 (Wang et al., describing the use of "grooves" filled with silver metal to form electrically-conductive microwires); U.S. Pat. No. 9,188,861 (Shukla et al.); U.S. Pat. No. 9,207,533 (Shukla et al.); U.S. Pat. No. 9,375,704 (Shukla); U.S. Pat. No. 9,377,688 (Shukla); U.S. Pat. No. 9,387,460 (Shukla); U.S. Pat. No. 9,475,889 (Shukla); U.S. Pat. No. 9,566,569 (Shukla et al.); U.S. Pat. No. 9,587,315 (Shukla et al.); U.S. Pat. No. 9,586,200 (Shukla et al.); U.S. Pat. No. 9,586,201 (Shukla et al.); U.S. Pat. No. 9,637,581 (Shukla et al.); U.S. Pat. No. 9,653,694 (Shukla et al.); U.S. Pat. No. 9,592,493 (Shukla et al.); U.S.

Pat. No. 9,617,642 (Shukla et al.); U.S. Pat. No. 9,624,582 (Shukla); U.S. Pat. No. 9,691,997 (Shukla et al.); U.S. Pat. No. 9,721,697 (Shukla et al.); U.S. Pat. No. 9,718,842 (Shukla); U.S. Pat. No. 9,809,606 (Shukla); U.S. Pat. No. 9,982,349 (Shukla et al.); U.S. Pat. No. 10,087,331 (Shukla et al.); U.S. Pat. No. 10,186,342 (Shukla); U.S. Pat. No. 10,214,657 (Shukla et al.); U.S. Pat. No. 10,246,561 (Shukla et al.); U.S. Pat. No. 10,311,990 (Shukla); U.S. Pat. No. 10,314,173 (Shukla et al.); U.S. Pat. No. 10,356,899 (Shukla et al.); U.S. Pat. No. 10,358,725 (Shukla et al.); U.S. Pat. No. 10,366,800 (Shukla et al.); U.S. Pat. No. 10,364,500 (Shukla et al.); U.S. Pat. No. 10,374,178 (Shukla et al.); U.S. Pat. No. 10,370,515 (Shukla et al.); U.S. Pat. No. 10,487,221 (Shukla et al.); U.S. Pat. No. 10,472,528 (Shukla et al.); U.S. Pat. No. 10,444,618 (Shukla et al.); U.S. Pat. No. 10,870,774B2 (Shukla et al.); U.S. Pat. No. 11,037,692 (Shukla et al.); and U.S. Pat. No. 11,041,078 (Shukla), the disclosures of all of which are incorporated herein with respect to the preparation and use of various silver precursor compositions (or catalytic inks) and for providing silver nanoparticles in metallic patterns, with or without electroless plating technology.

Thus, in some specific embodiments of a method according to the present invention, step A) can be carried out using steps A-1), A-2), and A-3). In step A-1), a pattern (or a plurality of patterns) of a catalytic ink as described above for example, containing reducible silver (+1) ions or reducible copper (+2) ions, can be provided in a suitable manner on the surface of the first substrate using various pattern-forming means such as printing techniques including but not limited to flexographic printing, screen printing, or inkjet printing. As used herein, the catalytic ink or an electrically-conductive metal-containing composition can be applied to the first substrate in a non-aqueous liquid and pattern-wise form, using pattern forming deposition methods and equipment, and having the requisite viscosity for a defined means of application.

Flexographic printing is particularly useful and illustrated in FIG. 1 described below. Such pattern of the catalytic ink can then be dried or "cured" in a suitable fashion in step A-2), if necessary, to provide seed metal particles (for example, in a form of a cured catalytic ink pattern) such as nanoparticles of silver metal or nanoparticles of copper metal, derived from reducible silver (+1) ions or reducible copper (+2) ions, respectively. In some embodiments, a curing step is not needed as metal seed particles are already present and drying the catalytic ink is sufficient (no metal ion reduction is needed). Some useful catalytic inks can also comprise one or more curable polymeric materials or curable polymer precursors. Such materials generally comprise compounds comprising one or more ethylenically unsaturated carbon-carbon double bonds that can be "cured," polymerized, or crosslinked by using suitable chemical curing or crosslinking agents, by exposure to suitable radiation such as UV or actinic radiation from a suitable radiation source, or by suitable drying processes with suitable heat. Suitable curing conditions can be readily determined by one skilled in the art, but some specific conditions are described below in relation to transferring step B'), depending upon whether the catalytic ink is transferred to a surface of a second substrate or it is left on the surface of the first substrate.

Catalytic inks useful in the practice of the present invention are described in considerable detail in the patents listed above, as well as other literature known to one skilled in the art. Any source of silver (+1) or copper (+2) can be used as long as that source is soluble within the non-aqueous solvents used to carry the reducible metal ions, reducing agents, and any other addenda. Cols. 10-15 of U.S. Pat. No. 10,870,774B2 (noted above) provide numerous examples of useful silver (+1) salts and organosilver complexes. Useful amounts of reducing agents and silver (+1) salts or organosilver precursor materials can also be readily determined from the considerable teaching known in the art.

Useful organic polymers can also be present in the catalytic inks, some of which can act as silver (+1) reducing agents, such as the cellulosic polymers described in Col. 9 of U.S. Pat. No. 10,870,774B2 (noted above). Other organic polymers can be present to serve as binder materials for obtaining smooth application and formation of the patterns of catalytic inks. Particularly useful polymeric binder materials of this type include but are not limited to, polyvinyl butyral(s). The amounts of such organic polymers can be readily determined by one of ordinary skill in the art in view of the teaching of the patents described above.

A carbon black can be provided in the catalytic ink if desired, and any suitable carbon black from a variety of commercial sources can be used in an amount that would be readily apparent to one skilled in the art from the teaching provided in col. 16 of U.S. Pat. No. 10,870,774B2 (noted above).

A representative catalytic ink that can be used in the practice of the present invention can comprise a dispersion of silver nanoparticles that have been formed by reduction of a silver (I) salt in the presence of a suitable silver (I) reducing agent such as a cellulosic polymer; a silver nanoparticle dispersing aid; a polyvinyl butyral or a poly(2-hydroxyethyl methacrylate [poly(HEMA)] binder polymer; and two or more non-aqueous (organic) solvents such as propylene glycol mono methyl ether, dipropylene glycol mono methyl ether, or mixtures thereof.

In some embodiments, curing of the pattern of catalytic ink in step A-2) is controlled such that the transfer of the metallic pattern in step B') is carried out while leaving substantially all of the catalytic ink pattern on the surface of the first substrate. In the case where the catalytic ink is UV-curable, this is generally accomplished by employing curing conditions such as high UV dosage, high temperature or combinations thereof to effectively overcure the ink, such that the adhesion of the ink is stronger to the substrate than the adhesion of the metal layer to the ink layer.

Alternatively, in other embodiments, curing of the pattern of the catalytic ink in step A-2) is controlled such that substantially all of the catalytic ink pattern is transferred together with the metallic pattern in B'). In such embodiments, the catalytic ink used to form this catalytic ink pattern is cured at a lower UV dosage, at a lower temperature, or combinations thereof, such that substantially all of the catalytic ink pattern is transferred together with the metallic pattern in step C).

Essential step A-1) and curing operation step A-2) can be followed by step A-3) comprising electrolessly plating a metal (such as copper) onto the pattern of the catalytic ink to form a metallic pattern of the surface of the first substrate. Electrolessly plating of a metal such as copper is illustrated in FIG. 2 described below.

Alternative chemical formulations containing silver nanoparticles that can be used as "seed" particles to form a metallic pattern in step A) are the electrically-conductive compositions described in U.S. Pat. No. 8,158,032 B2 (Liu et al.) and U.S. Pat. No. 10,208,224B2 (Song et al.), the disclosures of both of which are incorporated herein by reference in their entirety. The described compositions do not require any catalytic action to provide the silver nanoparticles and thus they are not strictly considered "catalytic inks" according to the present invention but they are printable compositions. The described electively-conductive compositions comprise organic compound-stabilized silver nanoparticles, an organic solvent medium, and a polyvinyl alcohol derivative resin in the described Formula (1) that comprises recurring units derived from a vinyl alcohol derivative, a vinyl ester, and a vinyl acetal such as vinyl butyral.

Alternatively a conductive silver paste can be used as described in U.S. Pat. No. 10,246,599B2 (Chopra et al.), the disclosure of which is incorporated herein by reference. This paste can be used to provide seed silver particles for electroless plating. Such conductive silver pastes are not strictly "catalytic inks" according to the present invention, but they are still useful to provide seed metal particles for the formation of a metallic pattern.

Useful first substrates for carrying out the present invention, for example, in step A) can be in the form of individual sheets or films of any desired shape, size, or surface area, or they can be in the form of a continuous web (such as a continuous transparent polymeric web) of any suitable length and width, which can then be used and processed in a roll-to-roll manufacturing process as illustrated for example in FIG. 1 that is described in more detail below.

Such first substrates are typically non-opaque or transparent, as transparency is described above. First substrates can be composed of any material (or combination of materials) as long as it does not inhibit the purpose of the present invention to form and transfer a metallic pattern in step B') to a surface of a second substrate. For example, first substrates can be formed from materials including but not limited to polymeric films, glasses (untreated or treated for example with tetrafluorocarbon plasma, hydrophobic fluorine, or a siloxane water-repellant material), or laminates of polymeric films or glasses, or both. The first substrate can have on one or both opposing generally planar surfaces, auxiliary polymeric or non-polymeric layers (such as primer layers) on which the metallic pattern can be formed, with or without a catalytic ink pattern. Useful polymer films can be composed of various single polymers or a mixtures of polymers, including but not limited to, acrylics, cellulosic polymers, polyesters (such as poly(ethylene terephthalate) (PET) and poly(ethylene naphthalate) (PEN), polystyrenes (including substituted and unsubstituted polystyrenes), polyamides, polycarbonates, polyolefins (such as polyethylene and polypropylene). Useful glasses can be commercially obtained as Corning® Glass or Willow® Glass). Thus, any material can be used that will withstand any processing or manufacturing temperatures or pressures, or contact with chemicals or processing baths used according to the present invention. Particularly useful first substrates are transparent polymeric films that can be provided in the form of continuous webs of one or more transparent polymeric films, and can be composed of a polyester such as poly(ethylene terephthalate) (PET), a polyolefin such as a polyethylene or a polypropylene, a polyacetal such as a polymer derived at least in part from vinyl butyral, or a polycarbonate. A laminate comprising a layer of poly(ethylene terephthalate) (PET) and a layer of a poly(vinyl butyral) (PVB) can also be used as a continuous web of a transparent polymeric film as the first substrate in the article and method of the present invention. For example, a transparent substrate can be composed of poly(ethylene terephthalate) (PET) that has on one or both opposing surfaces a primer layer comprising one or both of a polymer prepared at least in part from a vinyl butyral or poly(2-hydroxyethyl methacrylate).

The first substrate can have a dry thickness of at least 0.001 nm and up to and including 10 mm, and especially for transparent polymeric films, the first substrate dry thickness can be at least 0.008 mm and up to and including 0.2 mm. A skilled worker would be able to choose the appropriate thickness for a given manufacturing process or eventual use of the article prepared according to the present invention.

Useful second substrate materials, also described herein as "laminating films," used in the practice of this invention can be used in the same or different forms as described above for the first substrate, and can be composed of the same or different glasses or polymers, or laminates thereof. In most embodiments, the second substrate is transparent or can be made to become transparent, as that feature is defined for the first substrate, and in many embodiments, this transparent second substrate is a continuous transparent glass or transparent polymeric film or web comprising the same or different one or more organic polymers. The second substrate may be one that cannot be used in the flexographic printing process or cannot easily be used in an electroless plating bath. Preferred second substrates or laminating films are generally films composed of poly(vinyl butyral) (PVB), poly(ethylene vinyl acetate) (EVA), or an ionomeric film polymer as described above. Such films can function as adhesives and that may be translucent due to texturing, but when laminated to or between other substrates such as panes of sheets of glass, become transparent. Examples of poly (vinyl butyral) substrates particularly useful in the present invention are SAFLEX® QF51, RF41, and RE41 poly(vinyl butyral) products, and TROSIFOL® B500 and Clear B100MR poly(vinyl butyral) products.

Where the first substrate and the second substrate are both continuous webs such as continuous transparent polymeric films, they can be divided into individual first, second, and additional portions, sections, or regions on the surfaces on which the same or different electrically-conductive metal-containing patterns can be formed. The continuous article comprising the second substrate can be "finished" at some point to provide individual electrically-conductive metal-containing patterns for specific uses.

FIG. 1 illustrates the application of a catalytic ink or electrically-conductive composition to both sides of a continuous first substrate in a roll-to-roll printing operation to provide one or more patterns of catalytic ink or metal-containing compositions. Thus, FIG. 1 is a schematic side view of a flexographic printing system 100 that can be used for roll-to-roll flexographic printing of a catalytic ink on both sides of a substrate 150 (this can be considered a "first substrate" for purposes of this invention) for subsequent electroless plating, for example electroless plating of copper. This substrate 150 can also be a continuous web of transparent polymeric film [such as a film composed of biaxially oriented and heat set poly(ethylene terephthalate) for some embodiments of the present invention]. While this illustrated system shows flexographic printing on both sides of the first substrate, in many embodiments of the present invention, flexographic printing can be desired on only one surface of the first substrate and this illustrated method can be adapted for that use by one skilled in the art for step A-1). As noted in FIG. 1, substrate 150 is fed as a web from supply roll 102 to take-up roll 104 through flexographic printing system 100. Substrate 150 has a first surface 151 and a second surface 152.

The flexographic printing system 100 includes two print modules 120 and 140 that are configured to print on the first surface 151 of substrate 150, as well as two print modules 110 and 130 that are configured to print on the second surface 152 of substrate 150. The web of substrate 150 travels overall in roll-to-roll direction 105 (left to right in the example of FIG. 1). However, various rollers 106 and 107 are used to locally change the direction of the web of substrate as needed for adjusting web tension, providing a buffer, and reversing the substrate 150 for printing on an opposite side. In particular, it is to be noted that in print module 120, roller 107 serves to reverse the local direction of the web of substrate 150 so that it is moving substantially in a right-to-left direction.

Each of the print modules 110, 120, 130, 140 includes some similar components including a respective plate cylinder 111, 121, 131, 141, on which is mounted a respective flexographic printing plate 112, 122, 132, 142, respectively. Each flexographic printing plate 112, 122, 132, 142 has raised features 113 defining an image pattern to be printed on substrate 150. Each print module 110, 120, 130, 140 also includes a respective impression cylinder 114, 124, 134, 144 that is configured to force a side of substrate 150 into contact with the corresponding flexographic printing plate 112, 122, 132, 142. Impression cylinders 124 and 144 of print modules 120 and 140 (for printing on first surface 151 of substrate 150) rotate counter-clockwise in the view shown in FIG. 1, while impression cylinders 114 and 134 of print modules 110 and 130 (for printing on second surface 152 of substrate 150, when desired) rotate clockwise in this view.

Each print module 110, 120, 130, 140 also includes a respective anilox roller 115, 125, 135, 145 for providing a catalytic ink or metal-conductive composition to the corresponding flexographic printing plate 112, 122, 132, 142. As is well known in the printing industry, an anilox roller is a hard cylinder, usually constructed of a steel or aluminum core, having an outer surface containing millions of very fine dimples, known as cells. A catalytic ink or metal-conductive composition can be provided to the anilox roller by a tray or chambered reservoir (not shown). In some embodiments, some or all of the print modules 110, 120, 130, 140 also include respective UV curing stations 116, 126, 136, 146 for curing the printed catalytic ink or metal-containing composition on substrate 150.

Flexographic printing used according to the present invention can be carried out using any suitable commercially available flexographic printing elements (flexographic printing plates), for example the EKTAFLEX Flexographic Printing Plates available from Eastman Kodak, or the CYREL® Flexographic Photopolymer plates available from DuPont. Generally, useful flexographic printing plates can be constructed using the technology described for example in U.S. Pat. Nos. 7,799,504 (Zwadlo et al.) and 8,142,987 (Ali et al.), and in U.S. Pat. No. 8,530,142 (Zwadlo), the disclosures of all of which are incorporated herein by reference. In other embodiments, a flexographic printing plate can be prepared using the technologies described in the literature cited in Col. 25 of U.S. Pat. No. 10,870,774B2 (noted above).

The result from this operation illustrated according to FIG. 1, when used in the present invention, is a pattern of a catalytic ink, or metal-containing composition (that may not require curing) on the surface of the first substrate according to step A-1) and curing step A-2). As one would understand from the disclosure herein, these actions can also provide multiple (two or more) of the same or different cured patterns of a catalytic ink or metal-containing composition on the continuous web.

As noted above, this applied cured catalytic ink or metal-containing composition provides metal-containing particles, such as silver metal particles, that act as catalytic seed particles for electrolessly plated electrically-conductive metals. While the seed particles may be themselves electrically-conductive to some extent, it is often desirable to enhance the electrical conductivity of the resulting metallic pattern by forming another metal over them that has greater electrical conductivity, using for example electrolessly plating operations, such as called for in step A-3).

Once the one or more patterns of a catalytic ink or a metal-containing composition have been provided on the surface of the first substrate, and cured if necessary, an electrically-conductive metal can be formed thereon using electroless plating in step A-3), using a suitable metal plating composition containing for example, copper (+2), gold (+4), palladium (+2), aluminum (+3), nickel (+2), chromium (+2) silver (+1), or platinum (+2), or a combination of two or more of these metals. Plating baths containing such metallic ions and other chemical components are well known in the art, details of which are described in U.S. 10,870, 774B2 (noted above, see Cols. 26-27) and as published by Malloy et al. in Electroless Plating: Fundamentals and Applications, 1990. A particularly useful aqueous-based electroless plating system or bath is an electroless copper (+2) plating bath that contains formaldehyde as a reducing agent. Ethylene diamine tetraacetic acid (EDTA) or salts thereof can be present as a copper complexing agent. Copper electroless plating can be carried out at room temperature for seconds and up to several hours depending upon the desired deposition rate and plating copper thickness.

FIG. 2 is a schematic side view of a roll-to-roll electroless plating system 200 disclosed in U.S. Patent Application Publication 2016/0168713 (Reuter et al.), the disclosure of which is incorporated herein by reference. The roll-to-roll electroless plating system 200 includes a tank 230 of an aqueous plating solution 210, for example an aqueous copper (II) plating solution. A web of substrate 150 (for example, a first substrate having one or more cured catalytic patterns or patterns of metal-containing compositions on a surface thereof) is fed by a web advance system along a web-transport path in an in-track direction 205 from a supply roll 202 to a take-up roll 204. The web of substrate 150 is a substrate upon which electroless plating is to be performed. Drive roller 206 is positioned upstream of the aqueous plating solution 210 and drive roller 207 is positioned downstream of the aqueous plating solution 210. Drive rollers 206 and 207 advance the web of substrate 150 from the supply roll 202 through the tank of the aqueous plating solution 210 to the take-up roll 204. Web-guiding rollers 208 are at least partially submerged in the aqueous plating solution 210 in the tank 230 and guide the web of substrate 150 along the web-transport path in the in-track direction 205.

As the web of substrate 150 is advanced through the aqueous plating solution 210 in the tank 230, a metallic material as described above is electrolessly plated from the plating solution 210 onto predetermined locations (such as the one or more patterns of cured catalytic ink or patterns of metal-containing compositions) on one or both of a first surface 151 and a second surface 152 of the web of substrate 150. As a result, the concentration of the metallic material or other components in the aqueous plating solution 210 in the tank 230 decreases and the aqueous plating solution 210 needs to be refreshed. To refresh the aqueous plating solution 210, it is recirculated by pump 240, and replenished aqueous plating solution 215 from a reservoir 220 is added under the control of controller 242, which can include a valve (not shown). In the example shown in FIG. 2, aqueous plating solution 210 is moved from tank 230 to pump 240 through a drainpipe 232 and is returned from pump 240 to tank 230 through a return pipe 234. In order to remove particulates from aqueous plating solution 210, a filter 236 can be included, typically downstream of the pump 240.

After electrolessly plating, the resulting plated metallic pattern can be removed from the aqueous-based electroless plating bath or solution and rinsed using distilled water or another aqueous solution to remove any residual electroless plating chemistry.

The cumulative result of the processes described for steps A-1), A-2), and A-3) and for example embodiments, illustrated in FIGS. 1 and 2, are articles in the form of sheets or continuous web having one or more metallic patterns formed on a surface of the first substrate. These metallic patterns are typically electrically-conductive, and can be in the form of thin regular or irregular patterns of various electrically-conductive metal-containing a plurality of features such as lines, areas, or other designs or images having desired shape, thickness, height, and density, which can be spaced apart or connected, and which features can be the same or different for a plurality of metallic patterns.

For example, the same or different electrolessly plated metal patterns can comprise electrically-conductive metallic lines having an average dry width of at least 1 μm and up to and including 20 μm. The average dry height of each metallic line can be at least 0.1 μm or at least 0.2 μm or even at least 0.3 μm, and up to and including 2 μm or up to and including 3 μm or up to and including 5 μm.

Once the one or more metallic patterns are provided on a surface of the first substrate, each metallic pattern can be subjected to a "darkening" step B) as referenced above as provide first darkening agent to first surface of metallic pattern step 415 in FIG. 3 by applying a first darkening agent to a first surface of each of the one or more metallic patterns to form a first darkened surface of each metallic pattern that is arranged opposite the surface of the first substrate on which each metallic pattern is disposed. In simplified methods according to the present invention and as illustrated in FIG. 3, no darkening step is required.

This first darkening agent (that is sometimes known in the art as a "reflective reduction agent") is applied directly to the metallic pattern in a manner so that it "substantially conforms" to the metallic pattern, meaning that the first darkening agent covers the outer surface of the metallic pattern, such that it has the same basic shape as the outer surface of the metallic pattern. This first darkening agent covers the outer surface of the metallic pattern, including top surface and exposed (or available) sides of spaced apart or connected wires, dots, or other electrically-conductive features that comprise the metallic pattern as well as the sides thereof as they are exposed to a bath containing the first darkening agent. Typically, all of each element of the metallic pattern that is "exposed" to the darkening agent (in solution, mixture, or other form) is darkened. This operation reduces light reflection and glint off the metallic surfaces of the darkened surface of the metallic pattern when they are viewed from the "top" surface or side of the first substrate, or from the "bottom" or opposing surface or side of the second substrate after transfer in operation or step C).

Useful first darkening agents include but are not limited to, materials comprising metal oxides (such as copper oxide), metal sulfides (such as copper sulfide), metal selenides (such as copper selenide), but particularly useful darkening agents comprising palladium metal, nickel metal, and mixtures of any two or more of such materials. Materials comprising palladium metal are particularly useful first darkening agents especially when the metallic pattern comprises one or more of copper, gold, aluminum, silver, and platinum. The darkening effect is particularly useful when the first and second substrates are transparent polymeric films or glasses as described above. Such transparent polymeric films can be in the form of polymeric film webs so that multiple of the same or different electrically-conductive metal-containing patterns have darkened surfaces using the same or different first darkening agent. Darkening agents such as those described in U.S. Pat. No. 10,448,515B2 (Johal et al.) are particularly preferred. This disclosure is incorporated herein by reference with respect to darkening agents.

The first darkening agent can be applied to each metallic pattern by using procedures and conditions that would be apparent to one skilled in the art, and such conditions would depend upon the type of first darkening agent that is chosen. However, a specific darkening operation carried out using palladium metal or nickel metal includes using an electroless plating procedure such as that described with reference to FIG. 2 with an appropriate aqueous plating solution 210 (for example, a palladium plating solution such as that described in U.S. Pat. No. 10,448,515B2 (noted above). In some embodiments, the electroless plating process of FIG. 2 can sequentially feed the substrate 150 through two tanks 230 containing different aqueous plating solutions to provide the conductive metallic pattern and the first darkening agent as part of a single electroless plating operation.

The result of this operation or step B), is that the first darkened surface of each metallic pattern has an L* value that is reduced by at least 1 unit (or by at least 2 units or even by at least 3 units) compared to an L* value of the same surface of the metallic pattern provided in operation or step A) before application of the first darkening agent in step B). Generally, the L* value of the metallic pattern will be measured over an area of the surface defined by the aperture of the measurement device (for example, a spectroradiometer). Therefore, the measured L* value will be an area-weighted average of the L* value from the darkened metallic features and the substrate. Consequently, the reduction in the L* value will depend on the fraction of the substrate surface covered by the metallic features. For example, the L* value of a "dense mesh" pattern having more closely-spaced metallic features (or wider metallic features) will typically be reduced more than that of a "sparse mesh" pattern having more widely-spaced metallic features (or narrower metallic features).

It is further desirable that the first darkened surface of each metallic pattern formed in step B) has a C* value (that is, "chroma") that is closer to zero compared to a C* value of the same surface of the metallic pattern provided in step A) before application of the first darkening agent in operation or step B). For example, if the metallic features are formed using copper, they will have a coppery color which can appear quite colorful to an observer in certain viewing conditions. The darkened surface of the metallic pattern will preferably have a color that is closer to black or gray (that is, have a C* value that is closer to zero). Preferably the darkening agent reduces the C* value by at least 25%, and more preferably by at least 50%. The amount of C* value reduction will depend on the type of metal used for the metallic pattern. Metals such as copper will have a larger C* value than metals such as silver that are more neutral in appearance, and therefore the application of the first darkening agent to a copper surface would produce a larger C* value reduction.

The measurement devices used to measure the L* and the C* values will typically utilize an integrating sphere to integrate the reflected light over a hemisphere of reflectance angles. In many cases, the reflected light will have a highly directional characteristic. For example, the reflectance from the metallic features will be most visible at near specular reflectance angles. While there may be a highly visible coppery reflectance at the near specular reflectance angles, there may be a negligible reflectance at other angles. Therefore, the magnitude of the change in the measured L* and C* values will typically be significantly diluted relative to the change in the visual appearance at the near specular viewing angles. As a result, while the darkening agent will typically produce a dramatic reduction in the visible metallic reflection, the measured L* and C* values may only be reduced by a small value (for example, about 1 unit).

These features are thus achieved in carrying out step B) and are exhibited in the resulting article in which a metallic pattern (having a first darkened surface) is "sandwiched" between the first darkening agent and a second darkening agent (described below) on a transparent substrate wherein the first darkening agent is closest to the surface of the transparent substrate (or second substrate according to the inventive method).

After the "first darkening" operation or step B), the resulting metallic pattern having the first darkened surface is transferred to a surface of a second substrate (or laminating film) in step C) so that the first darkened surface is in direct contact with the surface of the second substrate. Such step C) is referenced as transfer metallic pattern to second substrate step 420 in FIG. 3 described above. This leaves an "opposing" or second surface of the metallic pattern "undarkened" or in its raw metallic appearance. This second undarkened surface exhibits the undarkened surface of the metallic pattern and presents a "bright," light-reflective surface to an observer.

For all embodiments of the present invention, this transfer step C) can be carried under suitable pressure, heat, or pressure and heat conditions to achieve the desired transfer of either: the metallic pattern with first darkened surface only, or a metallic pattern with first darkened surface as well as any cured catalytic ink pattern that may have been provided underneath the metallic pattern in some embodiments of this invention.

For example, in some embodiments of the inventive methods, the step C) transfer is carried out so that the contacted surface of the second substrate (or laminating film) adheres more strongly to the first darkened surface of the metallic pattern sufficient that when the first substrate and the second substrate are pulled apart after this transfer, substantially all of the metallic pattern and the first darkened surface remain on the surface of the second substrate instead of on the surface of the first substrate. In this context, the term "substantially all" or "substantially complete transfer" means that the metallic pattern was transferred sufficiently enough to maintain its required electrical functionality and be free of obvious visual defects in the metallic pattern and first darkened surface is transferred to the second substrate. This feature of substantially complete transfer can be achieved under various conditions relating to how the metallic pattern is created on the surface of the first substrate, the pressure and heat conditions used during the transfer operation, and the adhesive strength of the second substrate.

If the metallic pattern with the first darkened surface is disposed over a cured catalytic ink pattern as in steps A-1) through A-3), this transfer in step C) can be carried out in a manner such that substantially all of the catalytic ink pattern remains on the surface of the first substrate while the metallic pattern and first darkened surface are removed from the surface of the first substrate. In other words, the catalytic ink pattern is not transferred to the second substrate (or laminating film) to any significant extent. In this context, the term "significant extent" means less than 20% of the catalytic ink pattern is transferred. This effect can be achieved under various conditions relating to how the metallic pattern is disposed on the cured catalytic ink pattern, the composition of that cured catalytic ink pattern, the amount of curing, the type of surface and composition of the first substrate, the pressure and heat conditions used during the transfer operation, and the adhesive strength of the second substrate. One can determine the amount of cured catalytic ink pattern left on the surface of the first substrate by visual inspection, preferably with the aid of a magnifying loupe or an optical microscope. The degree of transfer can be assessed by estimating the amount of area removed relative to the total area intended for transfer. Curing is carried out sufficiently that the cured ink pattern is "substantially unremovable" from the first substrate surface. In other words, when the noted test is carried out, at least 80% of the cured catalytic ink pattern stays in the surface of the first substrate.

In other embodiments of the method according to the present invention, during this transfer step C), substantially all of the cured catalytic ink is transferred together with the metallic pattern. This effect would be substantially opposite to the effect of the previously described embodiments where substantially all of the cured catalytic ink remains on the surface of the first substrate. Similar to the noted effect, this feature of substantial transfer can be achieved under various conditions relating to how the metallic pattern is disposed on the cured catalytic ink pattern, the composition of that cured catalytic ink pattern, the amount of curing, type of surface of the first substrate, the pressure and heat conditions used during the transfer operation, and the adhesive strength of the second substrate (or laminating film). In particular, the type and extent of curing may make the catalytic ink pattern on the surface of the first substrate "substantially removable" from the first substrate surface. In other words, when the noted test is carried out, at least 80% of the cured catalytic ink pattern is removed from the surface of the first substrate during the transfer.

In some embodiments, once the noted transfer operation or step C) is carried out, step D) calls for applying a second darkening to the otherwise exposed second surface of the transferred metallic pattern (or of multiple metallic patterns), as referenced as apply second darkening agent to second surface of metallic pattern step 425 above in FIG. 3, to form a second darkened surface of the metallic pattern on the surface of the second substrate. This darkening operation or step typically darkens any exposed portion of the metallic pattern that was not previously darkened by the first darkening agent in operation or step B). In embodiments of the present invention, as illustrated in FIGS. 3 and 5, no second darkening agent is applied to the transferred metallic pattern.

For those embodiments in which darkening is used, this second darkening step D) can be carried out using any of the same or different darkening agents described above for the first darkening step B). In some embodiments, the first and second darkening agents are the same materials, such as materials comprising palladium metal or nickel metal, or particularly comprising palladium metal.

The result of this step D) provides the second darkened surface of the transferred metallic pattern having an L* value that is reduced by at least 1 unit (or by at least 2 units or even by at least 3 units) compared to an L* value of the undarkened surface of the transferred metallic pattern provided in step C) before application of the second darkening agent in step D).

Moreover, the second darkened surface of the transferred metallic pattern formed in step D) has a C* value that is closer to zero compared to a C* value of the transferred metallic pattern provided in step C) before application of the second darkening agent in step D).

It is also desirable that the first darkened surface of the metallic pattern formed in step B) has an L* value that is reduced by at least 1 unit (or by at least 2 units or even by at least 3 units) compared to an L* value of the metallic pattern provided in step A) before application of the first darkening agent in step B);

the second darkened surface of the transferred metallic pattern formed in step D) has an L* value that is reduced by at least 1 unit (or by at least 2 units or even by at least 3 units) compared to an L* value of the undarkened surface of the transferred metallic pattern provided in step C) before application of the second darkening agent in step D); and the L* value of the first darkened surface of the metallic pattern and the L* value of the second darkened surface of the transferred metallic pattern are the same values ±5 L* units.

Moreover, it is often desirable that the first darkened surface of the metallic pattern formed in step B) has a C* value that is closer to zero compared to a C* value of the metallic pattern provided in step A) before application of the first darkening agent in step B);

the second darkened surface of the transferred metallic pattern formed in step D) has a C* value that is closer to zero compared to a C* value of the transferred metallic pattern provided in step C) before application of the second darkening agent in step D); and the C* value of the first darkened surface of the metallic pattern and the C* value of the second darkened surface of the transferred metallic pattern are the same values, to within +25%.

In some embodiments, these features relating to the tolerance of C* values on both the first and second darkened surfaces can be independent of the tolerance of L* values on both the first and second darkened surfaces. Alternatively, in other embodiments, the features relating to the tolerance of C* values on both the first and second darkened surfaces exist in concurrence with the tolerance of L* values on both the first and second darkened surfaces.

The result of carrying out steps A) through D) then provides one or more electrically-conductive metal-containing patterns on the surface of the second substrate where the metal-containing patterns have a reduced visibility to a human observer when viewed from both sides of the second substrate. The result is a plurality of two or more of the same or different electrically-conductive metal-containing patterns on the surface of the second substrate (or laminating film), especially when such second substrate is a continuous web of transparent polymeric film such as a continuous web or film of poly(vinyl butyral), poly(ethylene vinyl acetate), or an ionomeric polymer. In some embodiments, the plurality of the same or different electrically-conductive metal-containing patterns comprises two or more different electrically-conductive metal-containing patterns. Such embodiments can provide articles described for example, in FIGS. 5A-5C and FIGS. 6A-6C of U.S. Pat. No. 10,524,356 (noted above), the disclosure of which patent is incorporated herein by reference.

Figures 4A, 4B:
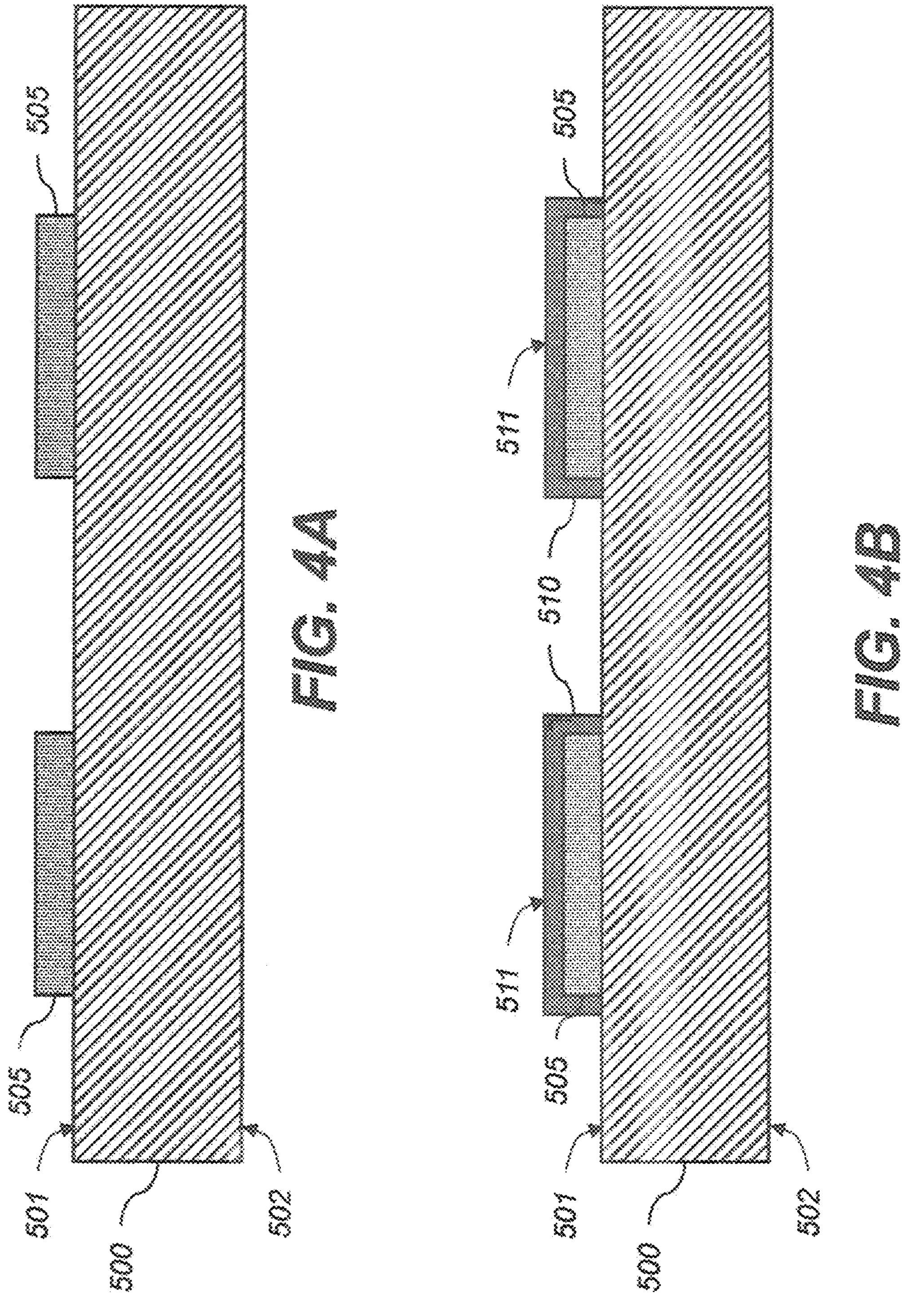
FIGS. 4A through 4E are cross-sectional views of articles, obtained at different stages of the method illustrated in FIG. 3.

FIGS. 4A-4E show representative intermediate articles created as illustrated in the flow chart of FIG. 3. In FIG. 4A, a metallic pattern 505 is shown as cross-sectioned and spaced apart metallic lines that are disposed on surface 501 of first substrate 500 using step A) (provide metallic pattern on first substrate step 410) according to the present invention. Substrate 500 has second surface 502.

In FIG. 4B, after step B), cross-sectioned first darkening agent 510 is shown as being directly applied in step B) (provide first darkening agent to first surface of metallic pattern step 415) over the lines of metallic pattern 505 to form a first darkened surface 511.

Figures 4C, 4D:
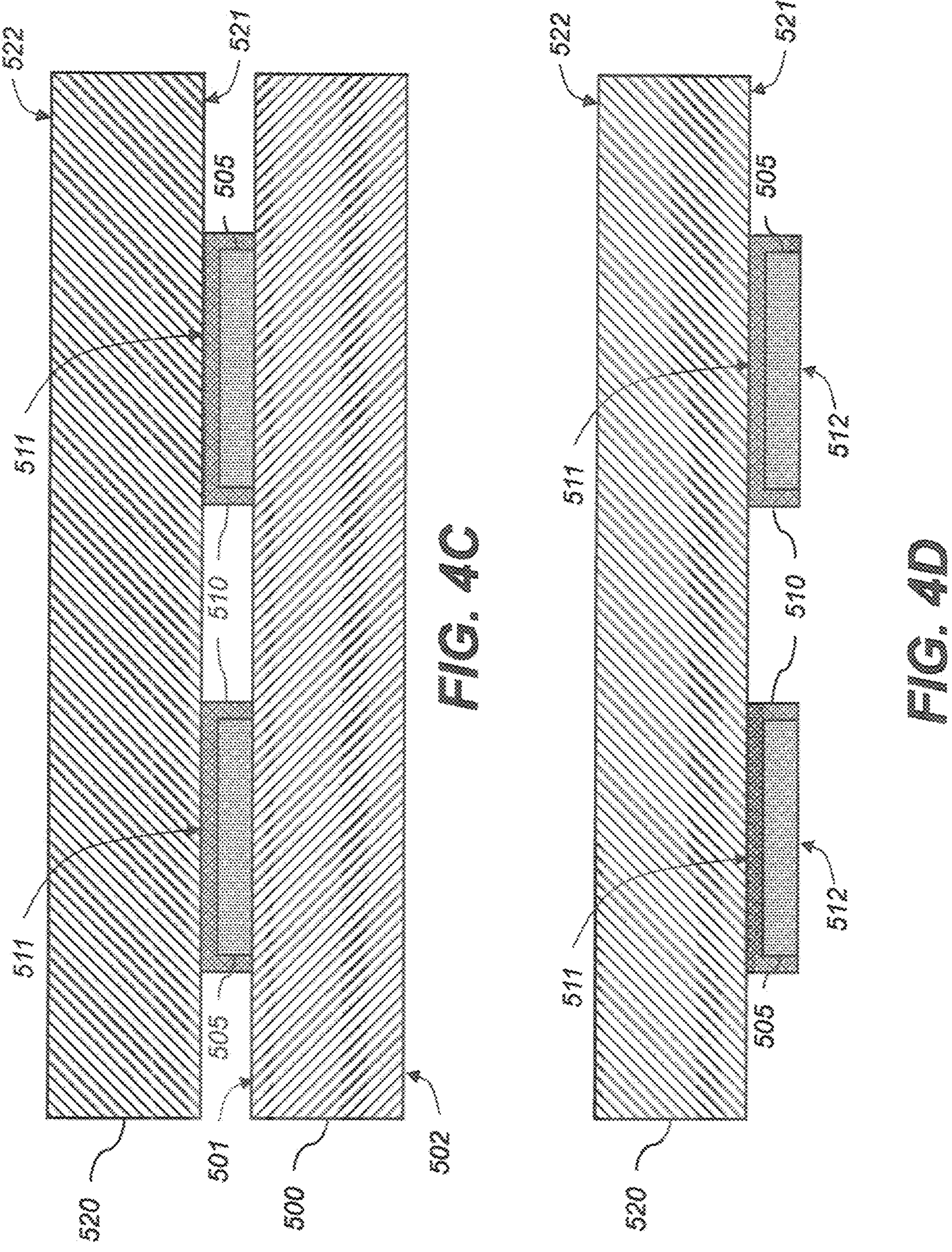

FIG. 4C then illustrates the direct or intimate contact of surface 521 of second substrate 520 with first darkened surface 511 that precedes the transfer of the first darkened surface 511 and metallic pattern 505 to surface 521, exposing undarkened surface 512 (FIG. 4D) of metallic pattern 505, according to step C) (transfer metallic pattern to second substrate step 420) of the present invention. Second substrate 520 has second surface 522.

As illustrated in FIG. 4D, first substrate 500 has thus been removed in a suitable manner, such as by pulling apart first substrate 500 from second substrate 520, with the first darkening agent 510 being predisposed to adhere more strongly to the surface 521 of second substrate 520 than to surface 501 of the first substrate 500.

Figure 4E:
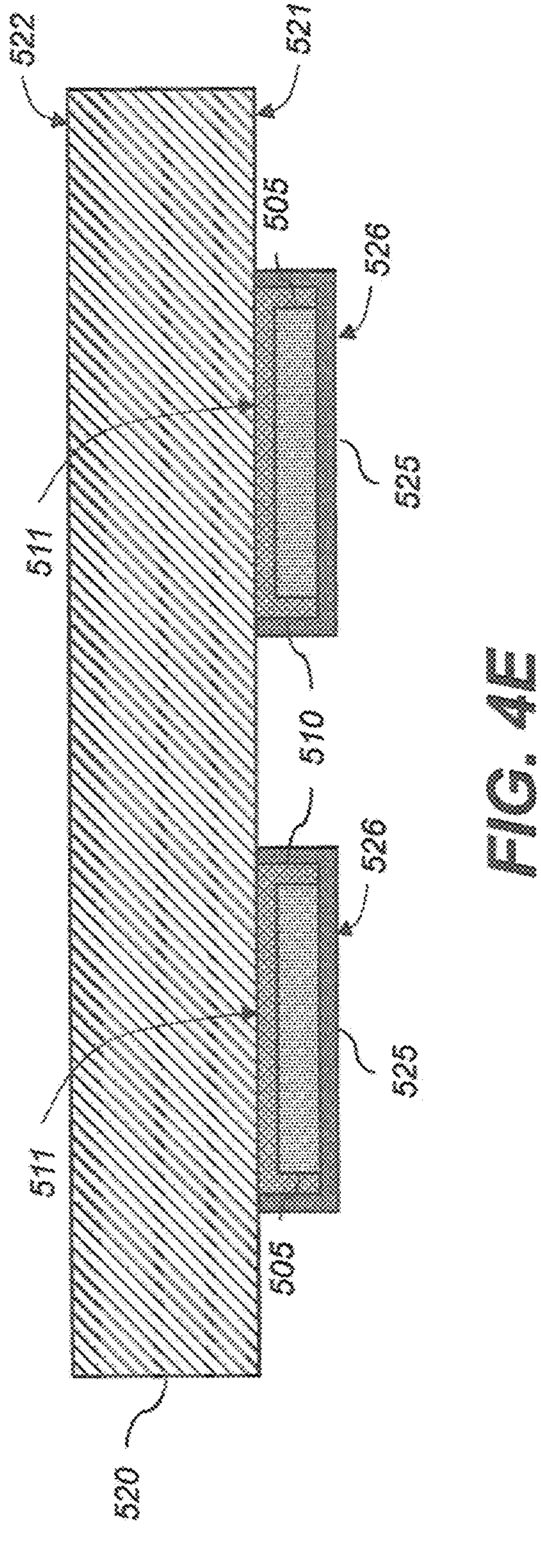

Lastly, as illustrated in FIG. 4E, a second darkening agent 525 is disposed on the undarkened surface 512 (FIG. 4D), according to step D) (apply second darkening agent to second surface of metallic pattern step 425) of the present invention, to provide a second darkened surface 526. The result is an article typically having a transparent substrate (illustrated as the second substrate 520 in FIGS. 4C-4E) that can be a laminating film, laminating interlayer, or laminating adhesive layer, and an electrically-conductive, metal-containing pattern disposed on the surface of the second substrate 520. This electrically-conductive, metal-containing pattern comprises, in order outwardly from surface 521 of the transparent substrate, as shown in FIG. 4E particularly, first darkening agent 510, metallic pattern 505, and second darkening agent 525. As illustrated in FIG. 4B, the first darkening agent 510 substantially conforms to the surface 501 of metallic pattern 505, forming first darkened surface 511. While in FIG. 4E, the second darkening agent 525 is shown as completely covering and conforming to the undarkened surface 512 (FIG. 4D) of the metallic pattern 505 (as well as the exposed sides of the metallic pattern 505 that are covered with the first darkening agent 510), forming second darkened surface 526, application of second darkening agent 525 may cover only a portion of undarkened surface 512 of the metallic pattern 505. In general, this portion amounts to at least 80% of the available surface area of exposed undarkened surface 512.

The article illustrated in FIGS. 4C and 4D can also be modified according to the present invention by which first darkening agent 510 is absent from surface 501 of metallic pattern 505 disposed over second substrate 520 that can be in the form of a transparent film such as a transparent laminating film.

Figure 5:
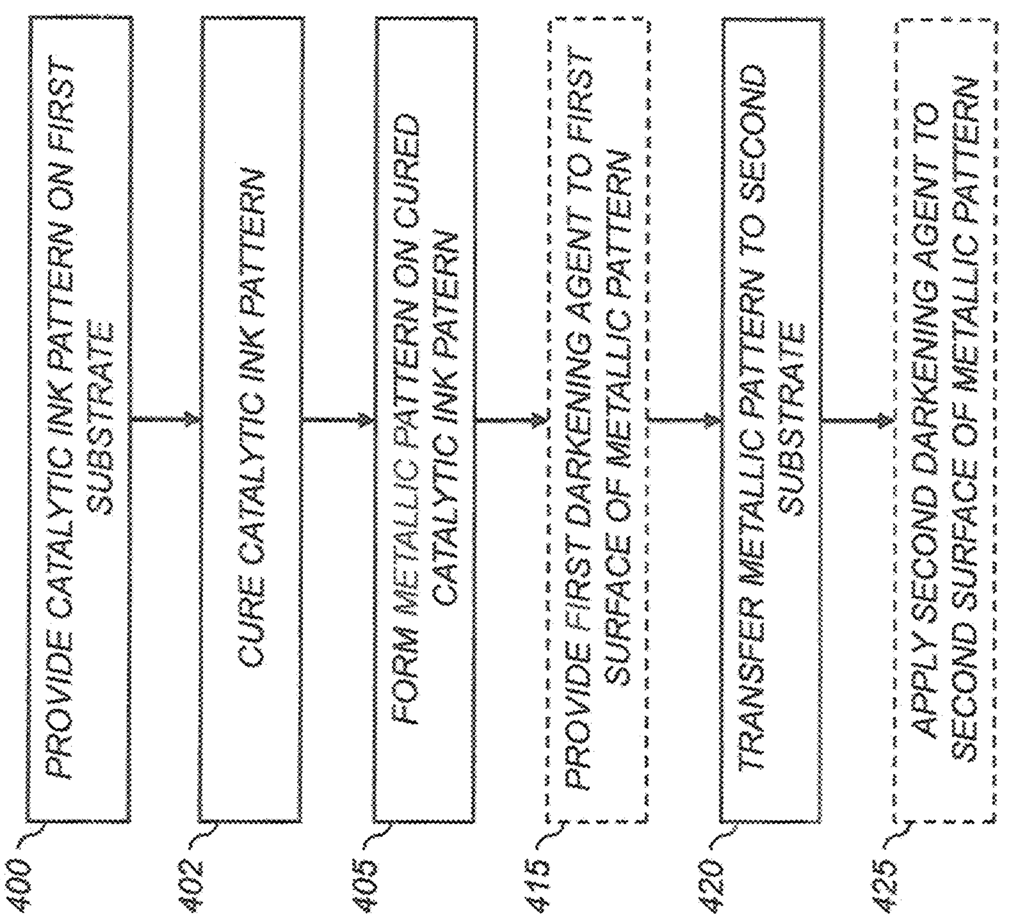
FIG. 5 is a flow diagram of the steps of another method useful to make articles with electrically-conductive, metal-containing patterns, with and without darkening steps.
Figures 6A, 6B:
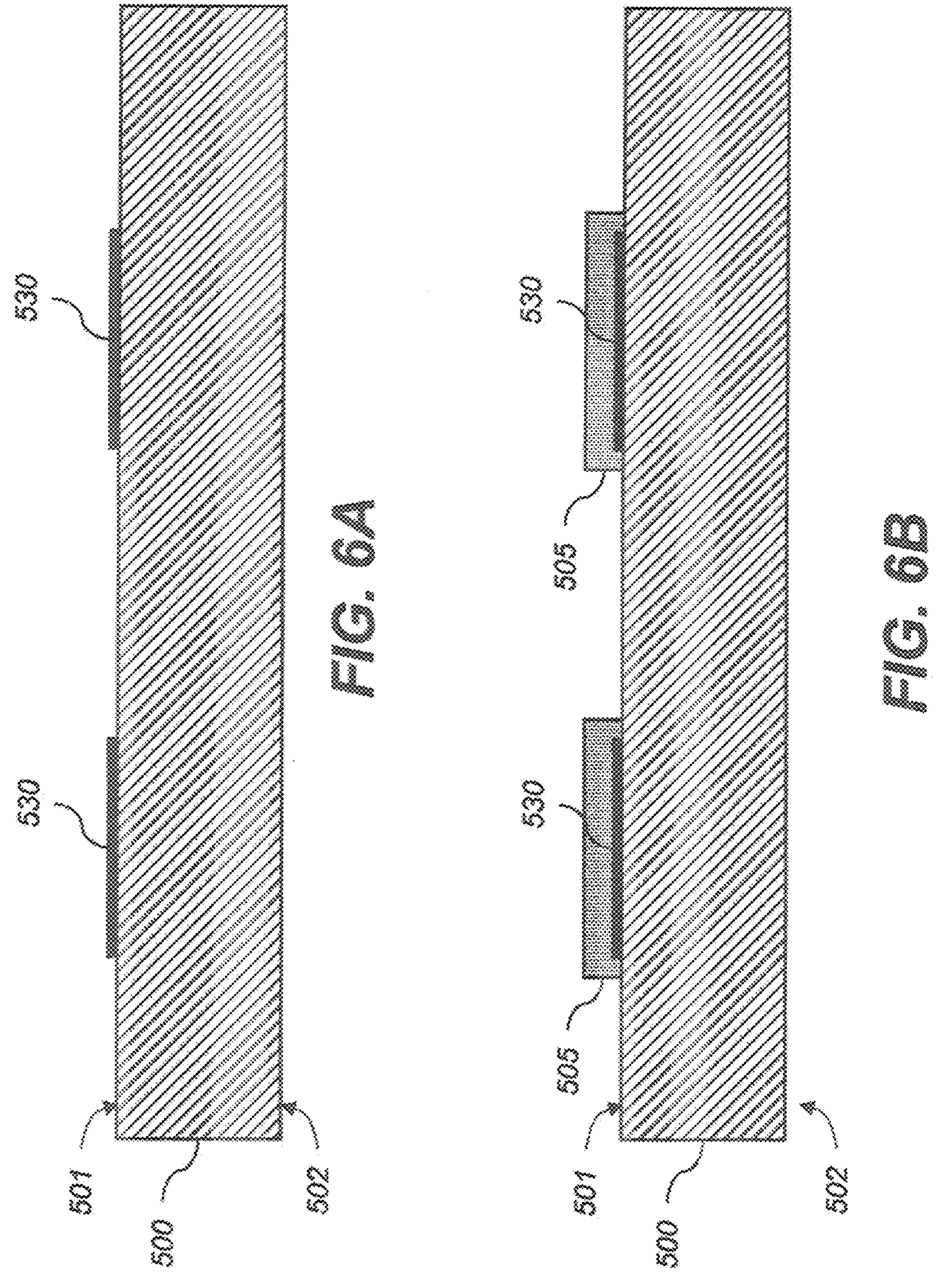
FIGS. 6A through 6H are cross-sectional views of articles, obtained at different stages of the method illustrated in FIG. 5.

FIGS. 6A-6H show representative intermediate articles created when carrying out a more specific method illustrated in the flow chart of FIG. 5. In FIG. 6A, pattern of catalytic ink 530 is shown as cross-sectioned and spaced apart lines that are disposed on surface 501 of first substrate 500 using step A-1) (provide catalytic ink pattern on first substrate step 400). Substrate 500 has second surface 502.

In FIG. 6B, after curing the pattern of catalytic ink 530 in step A-2) (cure catalytic ink pattern step 402), use of step A-3) (form metallic pattern on cured catalytic ink pattern step 405) results in metallic pattern 505 which is applied such that it is substantially conformed to (or substantially covers) the pattern of catalytic ink 530 on surface 501 of first substrate 500.

Figures 6C, 6D:
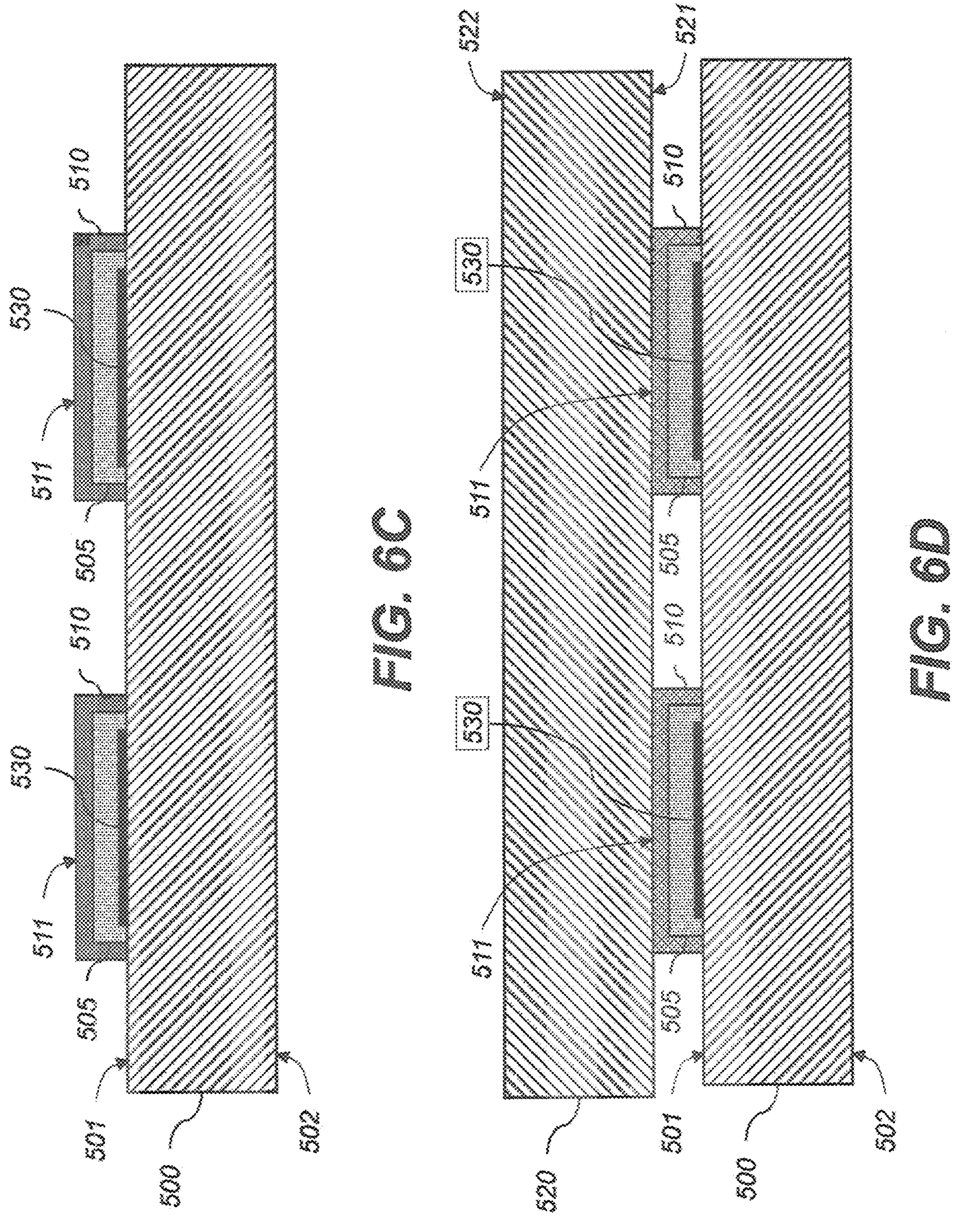

FIG. 6C shows the result of carrying out step B) (provide first darkening agent to first surface of metallic pattern step 415) in which cross-sectioned first darkening agent 510 is shown as being directly applied over metallic pattern 505 to form first darkened surface 511.

FIG. 6D then illustrates the direct or intimate contact of surface 521 of second substrate 520 with first darkened surface 511 that precedes the transfer of first darkened surface 511 and metallic pattern 505 to surface 521 of second substrate 520, according to step C) (transfer metallic pattern to second substrate step 420) of the present invention. Second substrate 520 has second surface 522.

Figure 6E:
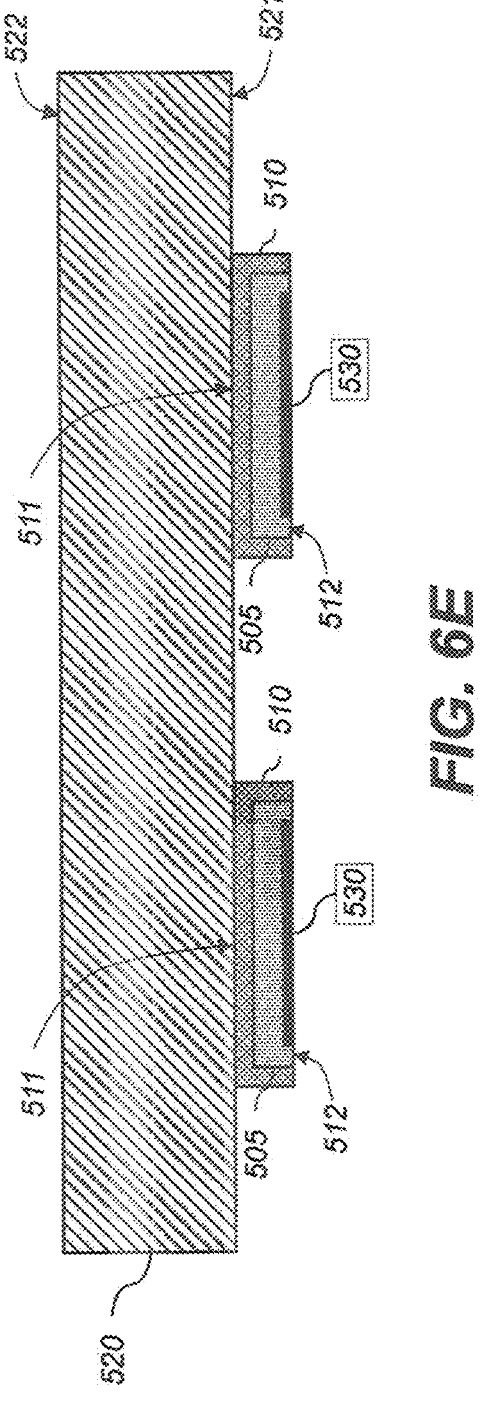

As shown in FIG. 6E, first substrate 500 has been removed in a suitable manner, such as by pulling apart first substrate 500 from second substrate 520, and first darkening agent 510 is predisposed to adhere more strongly to surface 521 of second substrate 520 than to surface 501 of first substrate 500. In the embodiment illustrated in FIG. 6E, pattern of catalytic ink 530 is predisposed to adhere more to metallic pattern 505 than to surface 501 of first substrate 500 so that substantially none of the pattern of catalytic ink 530 remains on surface 501 of first substrate 500 during this transfer step. A portion of metallic pattern 505 can display undarkened surface 512.

Figure 6F:
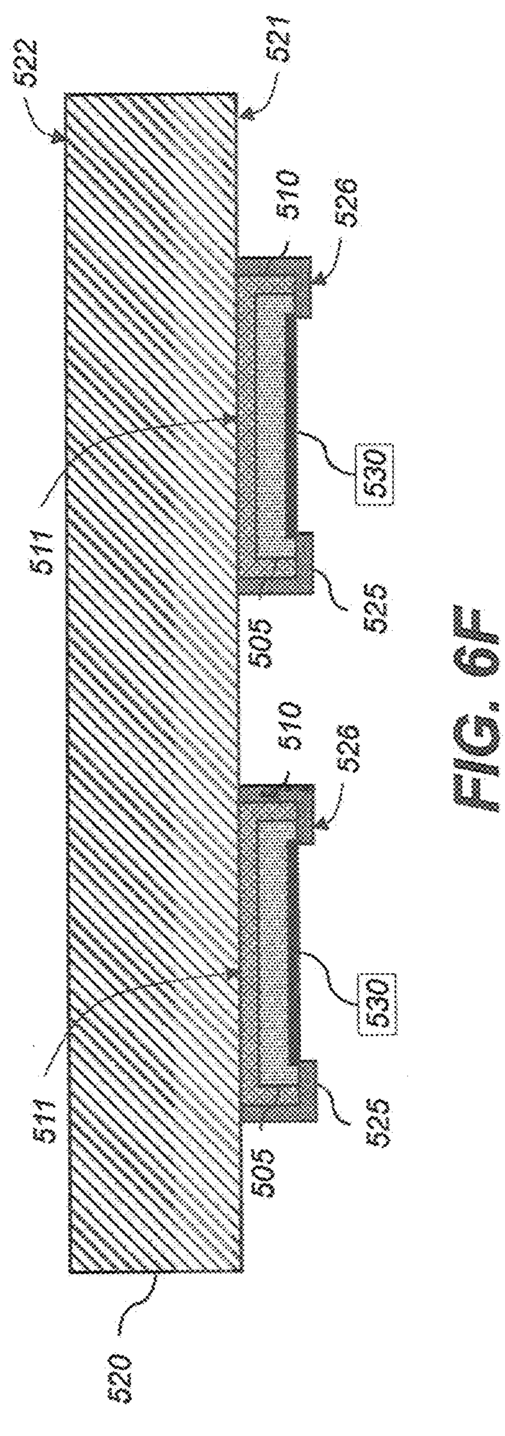

FIG. 6F then illustrates this embodiment by showing the application of second darkening agent 525 in step D) (apply second darkening agent to second surface of metallic pattern step 425) to undarkened surface 512 exposed in FIG. 6E, but because second darkening agent 525 weakly attaches or adheres to pattern of catalytic ink 530 to provide second darkened surface 526, one can see that while second darkening agent 525 generally covers any metallic pattern 505 and first darkening agent 510 that may be exposed to view, it will typically not cover a substantial portion of the exposed pattern of catalytic ink 530. In such embodiments as illustrated in FIGS. 6E and 6F, the portion of the surface of the metallic pattern 505 covered by the second darkening agent 525 is substantially non-overlapping with the portion of the surface of the metallic pattern 505 covered by the pattern of catalytic ink 530.

Alternatively, during the step C) that transfers the first darkening agent 510 and metallic pattern 505 to surface 521 of the second substrate 520, the pattern of catalytic ink 530 may be designed to stay substantially on surface 501 of first substrate 500 for reasons described above, as illustrated in FIG. 6G. In other words, the pattern of catalytic ink 530 is not substantially transferred to the second substrate 520; thus, the pattern of catalytic ink 530 is absent in FIG. 6G. In these embodiments, when step D) is carried out, second darkening agent 525 will generally entirely cover undarkened surface 512 of metallic pattern 505 to provide second darkened surface 526, as shown in FIG. 6H.

The product of this method is again an article that is described above and shown in both FIGS. 4E and 6H.

Figure 6G:
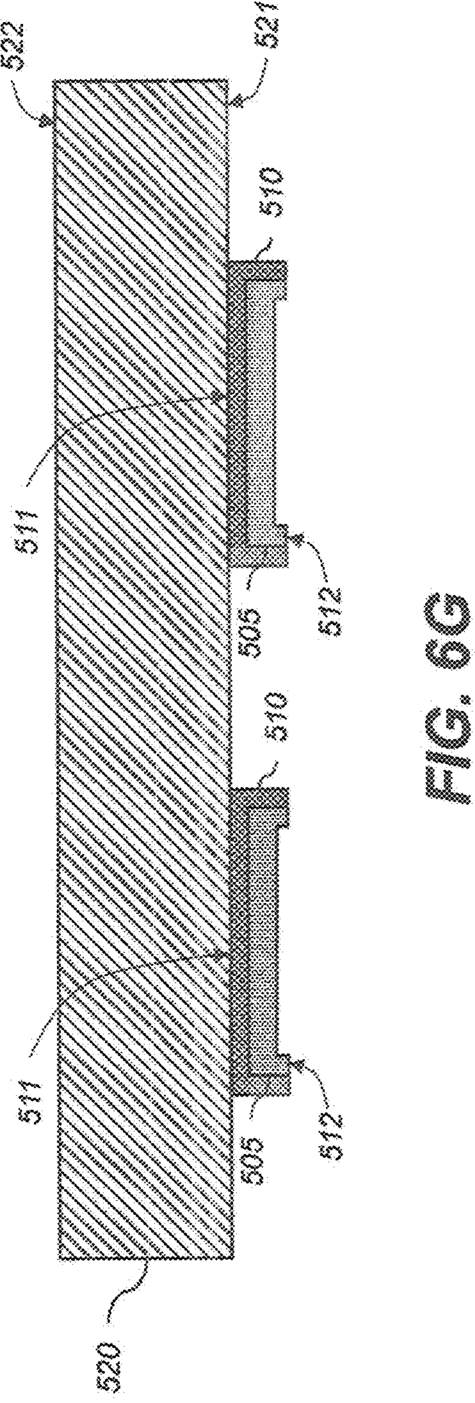
Figure 6H:
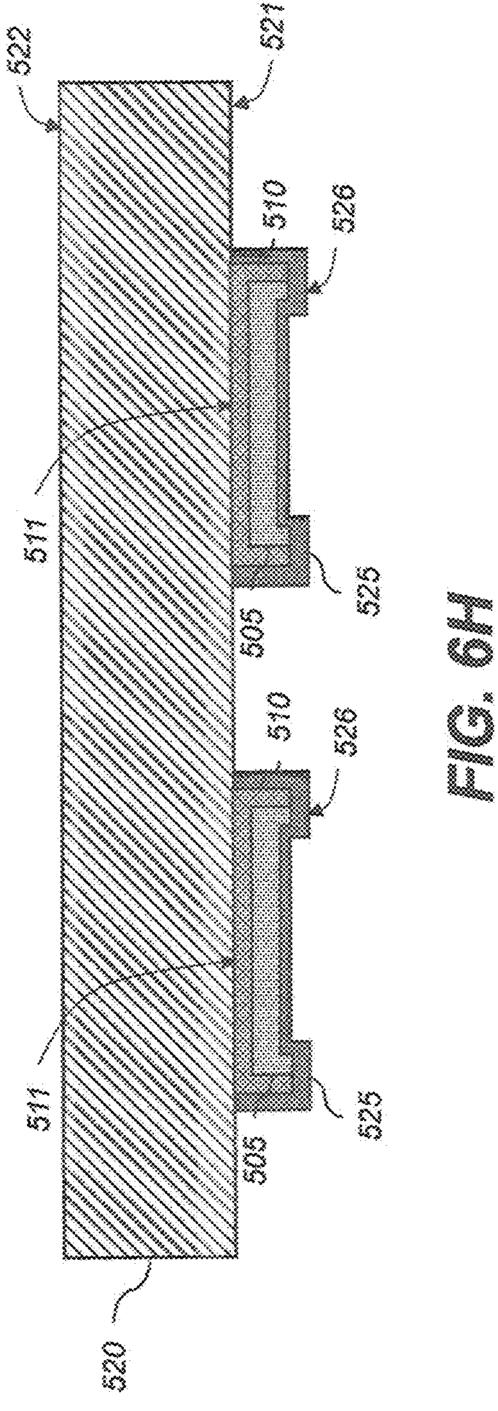

The article illustrated in FIG. 6G can also be modified according to the present invention by which first darkening agent 510 is absent from metallic pattern 505 disposed over second substrate 520 that can be in the form of a transparent film such as a transparent laminating film.

Articles

As noted above, the articles of the present invention (wherein darkening agents are absent) as well as those outside the scope of the present invention (with darkening agents present) typically comprise a transparent substrate of some type and can be designed to have any useful shape or form, such as in sheets or patches, which may contain one or more functional devices made using the conductive metallic pattern. In many embodiments, the articles are designed in the form of continuous webs of transparent polymeric films, each comprising a plurality of the same or different electrically-conductive metal-containing patterns. Such constructed continuous webs can be used soon after manufacture and suitably "finished" by cutting and slitting to provide smaller inventive articles having one or more of the same or different electrically-conductive metal-containing patterns. Alternatively, the continuous webs can be rolled up and subjected to finishing operations at a later time.

For example, in some embodiments, some articles of the present invention comprise:

a continuous web of transparent polymeric film (derived as a second substrate as described above), and particularly comprising a transparent film comprising polyester or a polyacetal including but not limited to a film comprising poly(vinyl butyral) (PVB), poly(ethylene vinyl acetate) (EVA), or an ionomeric polymer;

a plurality of the same or different electrically-conductive metal-containing patterns (as described above) spaced apart from each other (at a desirable distance or spacing) and disposed on a surface of the continuous web of the transparent polymeric film, wherein each of the electrically-conductive metal-containing pattern includes, in order outwardly from the surface of the continuous web of the transparent polymeric film:

optionally, a first darkening agent (as described above);

a metallic pattern (as described above); and optionally, a second darkening agent (as described above);

wherein the first darkening agent, when present, substantially conforms to a first surface of the metallic pattern, forming a first darkened surface on the metallic pattern; and wherein the second darkening agent, when present, is disposed over at least a portion of a second surface of the metallic pattern, forming a second darkened surface.

In particularly useful embodiments, the continuous web of transparent polymeric film can comprise a film of a poly(vinyl butyral). Primer layers can be disposed on other or both opposing sides of the transparent polymeric film.

In addition, in many embodiments, the plurality of the same or different electrically-conductive metal-containing patterns can comprise two or more of the same electrically-conductive metal-containing patterns. Alternatively, the plurality of the same or different electrically-conductive metal-containing patterns includes two or more different electrically-conductive metal-containing patterns.

As described above in general for some articles, the first darkened surface and the second darkened surface of the metallic pattern of each of the same or different electrically-conductive metal-containing patterns, independently have an L* value that is reduced by at least 1 unit (or by at least 2 units or even by at least 3 units) compared to an L* value of the undarkened surface of the metallic pattern in the absence of the first and second darkening agents, respectively.

In many embodiments, the L* value of the first darkened surface of the metallic pattern and the L* value of the second darkened surface of the transferred metallic pattern, of each of the same or different electrically-conductive metal-containing patterns, are the same values, ±5 L* units.

Moreover, the C* values of the first darkened surface and of the second darkened surface of the metallic pattern of each of the same or different electrically-conductive metal-containing patterns are independently closer to zero than C* values of the metallic pattern in the absence of the first and second darkening agents, respectively. This C* value feature can be present in the continuous web article independently of the L* value feature described in the preceding paragraphs, but in some embodiments, both the described L* and C* values are present in the article.

In addition, the C* value of the first darkened surface of the metallic pattern and the C* value of the second darkened surface of the transferred metallic pattern, of each of the same or different electrically-conductive metal-containing patterns, can be the same values (for example, to within +25%), and this C* feature can be independent of the L* values on both the first darkened surface and the second darkened surface.

As noted above, generally, the first and second darkening agents are the same materials for each of the same or different electrically-conductive metal-containing patterns, and such first and second darkening agents can comprise palladium metal or nickel metal. Moreover, the metallic pattern of each of the same or different electrically-conductive metal-containing patterns, can comprise copper, gold, aluminum, silver, or platinum.

In some embodiments of the present invention each of the same or different electrically-conductive metal-containing patterns can further comprise a cured or uncured catalytic ink disposed over at least a portion of the second surface of the metallic pattern. Such embodiments exist when the catalytic ink, for example as a pattern of cured catalytic ink as described above, is transferred at least in part from the first substrate to the second substrate, as illustrated for example in FIG. 6F.

The portion of the second surface of the metallic pattern covered by the second darkening agent, of each of the same or different electrically-conductive metal-containing patterns, can be substantially non-overlapping with the portion of the second surface of the metallic pattern covered by the catalytic ink, also as illustrated in FIG. 6F.

Such articles can be designed with one or more of the same or different electrically-conductive metal-containing patterns, in which the metallic pattern of each of the same or different electrically-conductive metal-containing patterns can comprise a plurality of features that can be spaced apart or connected. These plurality of features can be the same or different for each metallic pattern so that each electrically-conductive metal-containing pattern can be ultimately used for the same or different purpose.

In some embodiments, an inventive article prepared according to the present invention can be designed for use as a thin-film antenna that can be placed in a portion of a window (for example, between two panes of glass) where a high level of optical transparency is not critical, such as in the top or bottom portion of a vehicle windshield thereby forming a composite article of the present invention. In such cases, the optical transparency and color of the thin-film antenna can be controlled to substantially match the transparency of any tinted region of the vehicle windshield, or the composite article itself can actually serve to provide the tinting.

In some embodiments of the present invention, one or more of the same or different electrically-conductive metal-containing patterns can be spaced closely together on a continuous web for efficiency of production, but can be transferred to the second substrate at the same spacing or at greater spacing by advancing the second substrate to a desired location before effecting the transfer step.

Exemplary placement of articles (for example, thin-film antennae) according to the present invention in vehicles as composite articles is illustrated in FIG. 7 that shows automobile 700 where a shade band, shown as tinted region 710, is provided at the top of windshield 705. Two composite antennas 704, such as those described and illustrated in FIG. 5C of U.S. Pat. No. 10,524,356 (noted above) are provided in tinted region 710. The average optical transparency and color of composite antenna 704 are controlled to closely match each other and to match that of tinted region 710 such that composite antenna 704 is visually indistinguishable to an un-aided observer at a normal viewing distance.

In some applications, it is useful to provide a variety of antennas in the windows of automobile 700 to serve various purposes (for example, AM radio, FM radio, GPS, cell phone, Wi-Fi, and the like). In the illustrated configuration, in addition to the multiple composite antennae 704 provided in tinted region 710 of windshield 705, an additional composite antenna 708 is provided in a lower corner of windshield 705, and two additional composite antennas 708 are provided in rear window 715. In this case, additional composite antennae 708 include transition regions 310 as shown in FIG. 6C of U.S. Pat. No. 10,524,356 (noted above) to reduce the visibility of the edges of the antenna regions.

It will be obvious to one skilled in the art that transparent composite antennas 704 prepared according to the present invention can be used for a wide variety of other applications. For example, they can be incorporated into other types of windows such as building windows and helmet visors (such as motorcycle helmets, athletic helmets, or military helmets), or into any other type of transparent or semi-transparent surface (such as tinted windows or visors). They can also be overlaid onto an opaque surface (such as a wall) so that they are substantially undetectable to an observer. FIG. 8 shows an example of composite antenna 704 incorporated into window 810 of building 800. The same could be done in any window, for example in aircraft, ship, or office screens or transparent partitions. FIG. 9 shows an example of composite antenna 704 incorporated into visor 930 of helmet 920. Such a helmet could be used for motorcyclists, athletic personnel, helicopter pilots, or for any other individual wearing a helmet. In any of these uses, window 810 or visor 930 can include a tint, in which case the transparency and color of composite antenna 704 can be controlled to match the tint or to produce the desired tint. The usefulness of the articles provided by the present invention is virtually limited only by the imagination and ingenuity of the user. Other details of potential uses are described for example in U.S. Pat. No. 10,524,356 (noted above). For example, an exemplary use referenced as thin-film antenna 300 in FIG. 3 of this patent and details provided therein, shows a compound multi-frequency RF antenna pattern that includes features similar to those found in a slot antenna such as that shown in U.S. Pat. No. 6,911,952 (Sievenpiper) and an aperture antenna such as that shown in U.S. Pat. No. 7,233,296 (Song et al.), the disclosures of both of which patents are incorporated herein by reference.

Figures 10A, 10B:
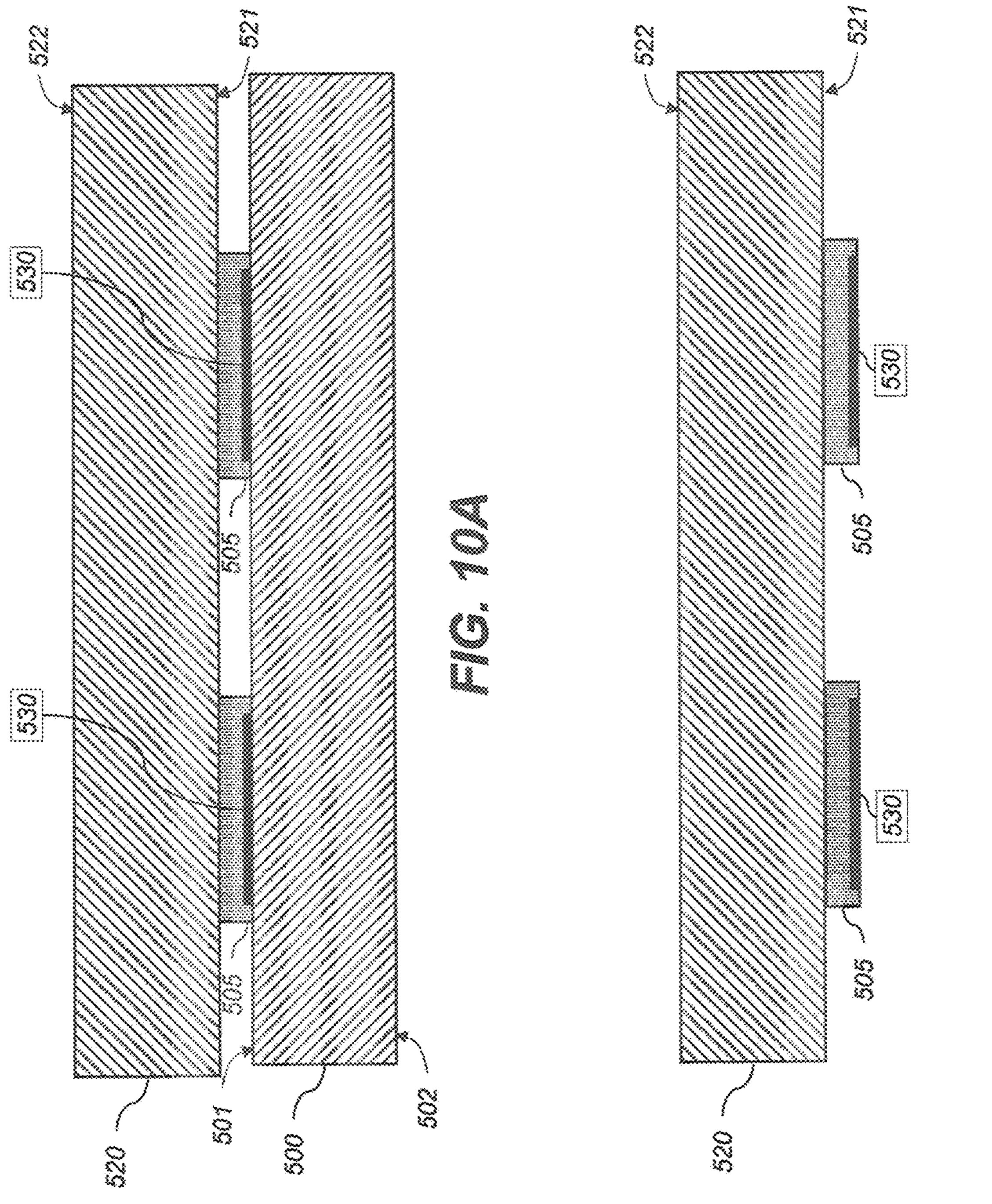
FIGS. 10A through 10D are cross-sectional view of articles of the present invention that are prepared without darkening agents.

The embodiments illustrated in FIGS. 4A-4E and 6A-6H include first and second darkening agents 510 and 525 applied to the surfaces of metallic pattern 505. However, in some embodiments, the darkening of the surfaces is not necessary. FIGS. 6A, 6B, 10A, and 10B illustrate an alternate embodiment according to the present invention where no darkening agents are applied as shown in FIGS. 6A-6B and illustrate the formation of a catalytic ink pattern 530 (for example, using a flexographic printing process) followed by the formation of metallic pattern 505 (for example, using an electroless plating process). However, in this case, rather than applying a darkening agent, first substrate 500 with metallic pattern 505 is brought into contact with second substrate 520 and transferred thereto as illustrated in FIGS. 10A-10B. In an exemplary embodiment, second substrate 520 is a laminating film that can be laminated between two pieces of material including transparent materials such as sheets or panes of glass or panes of another suitable transparent rigid substrate. The laminating film is typically a transparent polymeric material that provides a laminating function under the application of heat with or without pressure or by application of pressure alone. In a preferred embodiment, the laminating film is a film composed of poly(vinyl butyral) (PVB), poly(ethylene vinyl acetate) (EVA), or an ionomeric polymer. However, any appropriate material known in the art can be used for the laminating film.

Figures 10C, 10D:
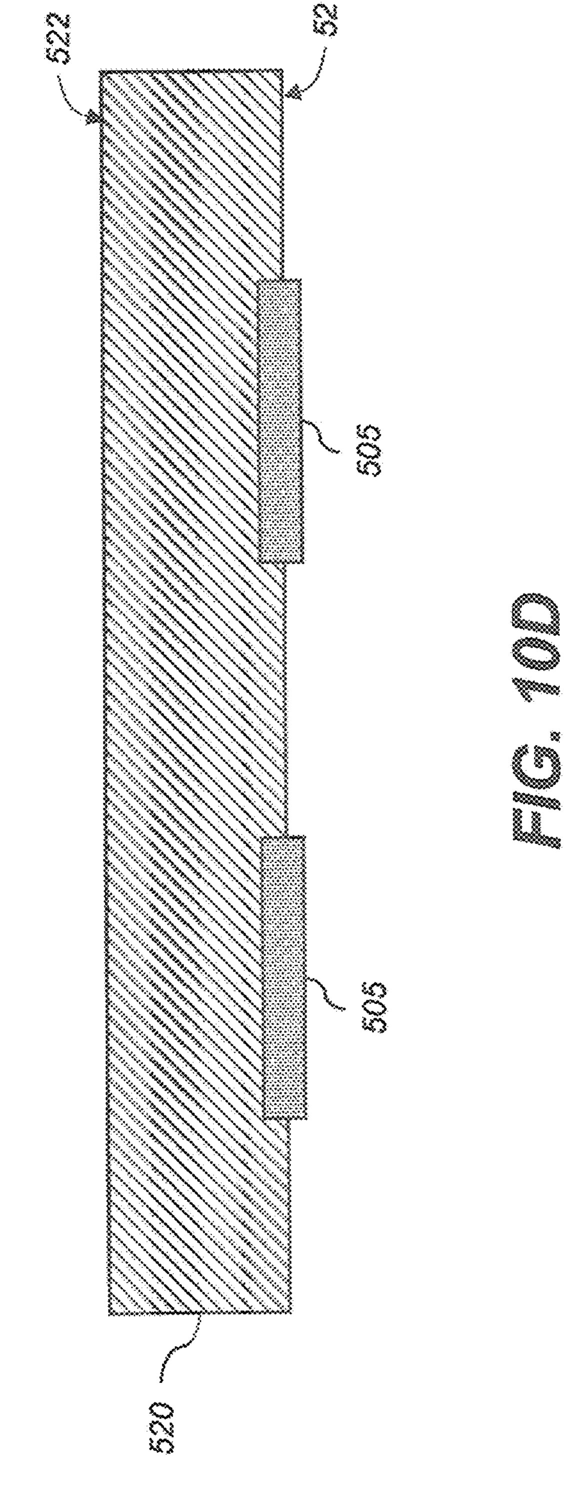

In some embodiments, catalytic ink pattern 530 may not be transferred to second substrate 520 together with metallic pattern 505 as illustrated in FIG. 10C. This figure is also representative of an embodiment wherein metallic pattern 505 is formed on first substrate 500 without the use of catalytic ink pattern 530. For example, metallic pattern 505 can be formed by directly printing an electrically-conductive ink such as an ink containing metallic nanoparticles as discussed earlier. In various embodiments, any method known in the art can be used to form metallic pattern 505 on first substrate 500.

It should be noted that while the preceding discussion has used the term "on" to describe the positions of the various materials relative to the substrates, this language should not be interpreted to mean that the substrate necessarily has a flat surface (as shown in the various figures) and that the material is on top of the flat surface. In some embodiments, a material can be embedded partially or fully into the surface of the substrate. Such configurations are considered to be within the scope of the term "on." For example, FIG. 10D illustrates a configuration where metallic pattern 505 is partially embedded into surface 521 of second substrate 520 during the process of transferring the metallic pattern 505 from first substrate 500 to second substrate 520. This configuration can occur for embodiments where second substrate 520 is a pliable laminating film (or laminating interlayer or adhesive layer) such as a poly(vinyl butyral) film, where metallic pattern 505 is pressed at least partially into surface 521.

Figure 11A:
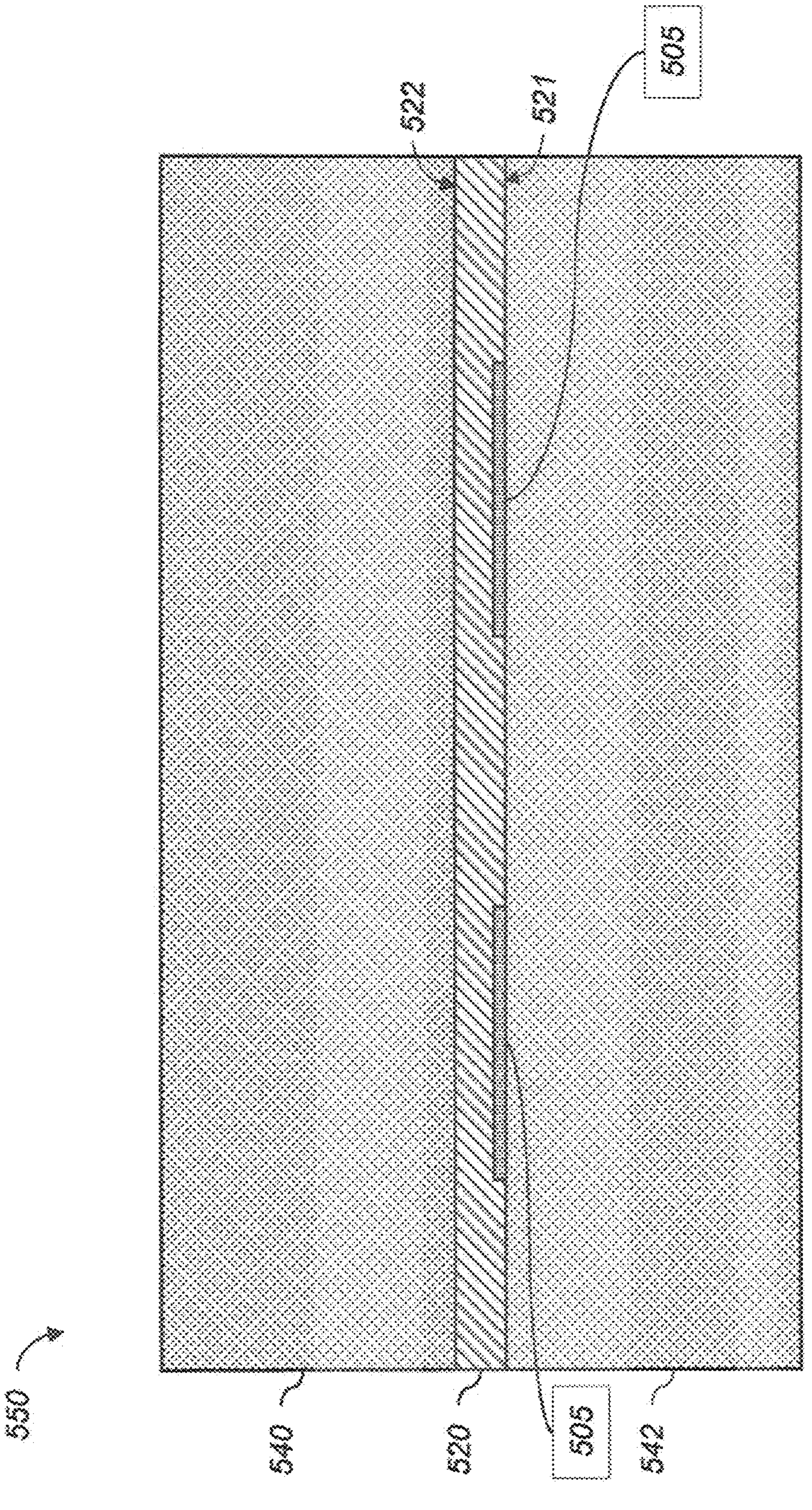
FIGS. 11A and 11B illustrate different embodiments of composite articles of the present invention that are prepared without darkening agents.

FIG. 11A illustrates an example of a composite article 550 formed by laminating second substrate 520 (for example a PVB film) with metallic pattern 505 between two glass panes 540 and 542. For example, composite article 550 can be windshield 705 for automobile 700 as illustrated in FIG. 7. During the lamination process, heat and pressure are applied to bond two glass panes 540 and 542 together, with second substrate 520 serving as an adhesive layer. In such embodiments, second substrate 520 typically softens so that metallic pattern 505 is fully embedded into second substrate 520.

Figure 11B:
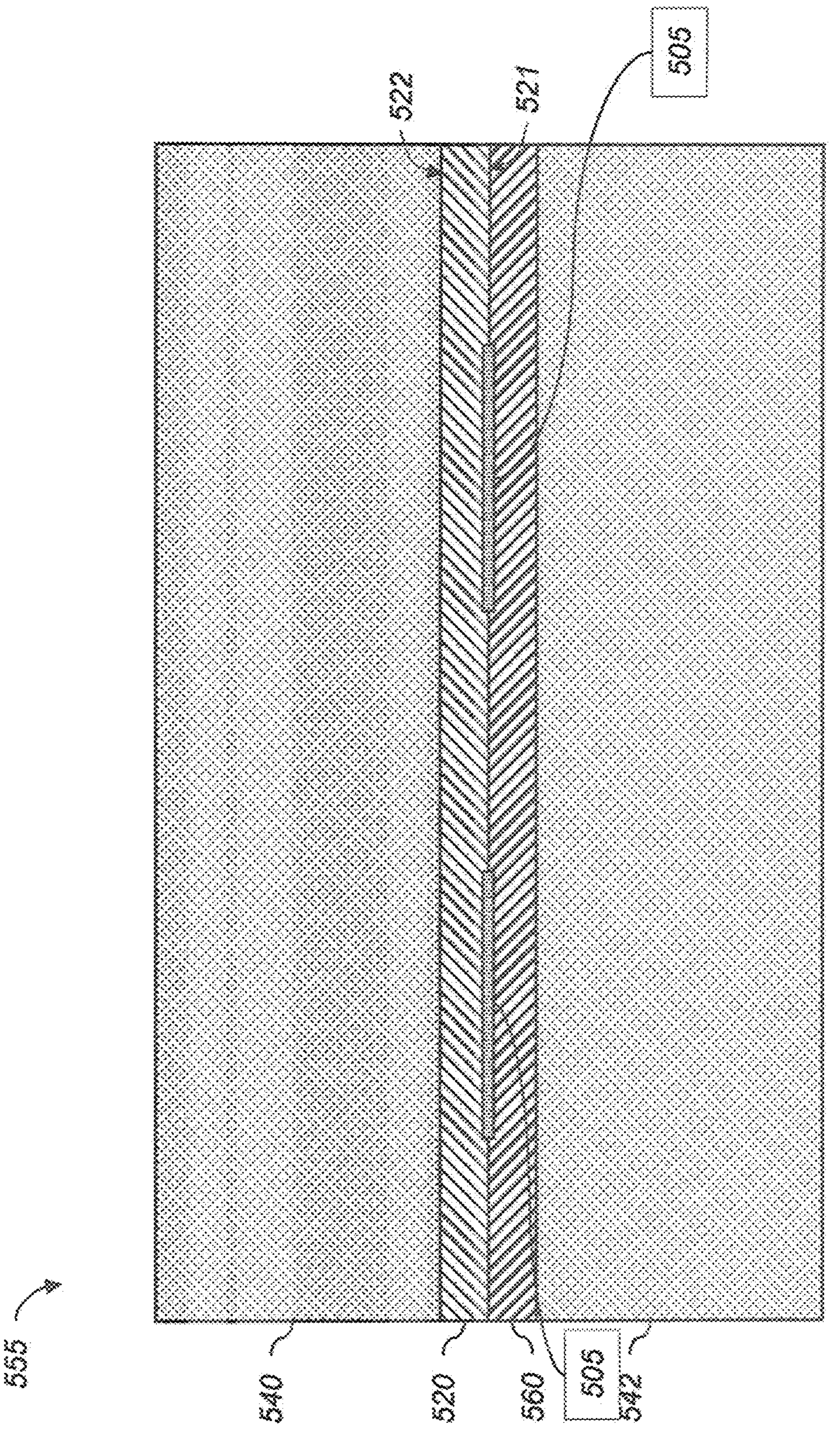

In addition, FIG. 11B illustrates another embodiment of composite article 555 of the present invention in which additional adhesive layer 560 (for example, an additional film of PVB) is included between two glass panes 540 and 542 during the lamination process. Typically, additional adhesive layer 560 will be adjacent to surface 521 of second substrate 520 so that metallic pattern 505 is encapsulated between the adhesive layers (for example, between two PVB films).

The following Examples are provided to illustrate the practice of this invention and are not meant to be limiting in any manner.

Example 1

An article comprising an electrically-conductive metal-containing pattern was fabricated using the following steps.

A photocurable catalyst ink composition according to this invention was prepared by mixing the following materials, expressed as weight percents of the total formulation weight: 14.4% of epoxy acrylates (CN 153 from Sartomer), 9.9% of poly(ethylene glycol) diacrylate (Mn of 258, Aldrich), 2.1% of poly(ethylene glycol) diacrylate (Mn of 575, Aldrich), 10.8% of pentaerythritol tetraacrylate (Sartomer), 0.8% of triaryl sulfonium salt hexafluorophosphate mixed in 50% of propylene carbonate (Aldrich), 0.8% of triaryl sulfonium salt hexafluoroantimonate mixed in 50% propylene carbonate (Aldrich), 2.4% of free radical photoinitiator hydroxycyclohexyl phenyl ketone (Aldrich), 1.2% of free radical photoinitiator methyl-4'-(methylthio)-2-morpholinopropiophenone (Aldrich), 19.5% of silver nanoparticles (Novacentrix, 20-25 nm average particle size, Ag-25-ST3), 1.1% of carbon nanoparticles (US1074 from US Nano), 2.0% of ethyl-4-(dimethylamino)benzoate (Aldrich), 0.001% of 9-fluorenone (Aldrich), 0.02% of hydroquinone (Aldrich), and 35% of 1-methoxy isopropanol (Dowanol PM, Dow Chemical) solvent.

A mask was written with a predetermined pattern using the KODAK EKTAFLEX Imager with Kodak Square Spot laser technology at a resolution of 12,800 dpi on a KODAK EKTAFLEX Thermal Imaging Layer. The mask was laminated to a commercially available 1.14 mm Kodak EKTAFLEX photopolymer plate precursor (Eastman Kodak Company). The flexographic plate precursor was exposed to UV energy sufficient to provide a cured relief image in the printing plate precursor. The mask was removed from the plate and the plate was processed (developed) using known conditions suggested for these relief printing members by the manufacturer. The flexographic plate was adhered to the printing form cylinder using 3M™ Cushion-Mount™ Plus Plate Mounting Tape E1120. The relief image design in the flexographic printing plates included a grid pattern with 10 μm fine lines spaced 225 μm apart.

A sample of a printed pattern of the photocurable composition described above was delivered to the flexographic printing plate from a 0.5 BCM, 2000 lines/inch (787.4 lines/cm) anilox roller was printed on a 50 μm thick first substrate, MELINEX® STCH22 polyester film (DuPont Teijin Films) using a Mark-Andy P7 Narrow Web Flexographic Printing Press.

After printing, each printed pattern of photocurable composition was irradiated with UV radiation using a GEW mercury lamp providing irradiation wavelengths between 190 nm and 1500 nm, with an approximate exposure of 440 $mJ/cm^2$ to cure each printing pattern of the patterned material immediately. The printed average line widths of the cured patterns were measured to be 14.9 μm wide.

The cured patterns on the first substrate were electrolessly copper plated using ENPLATE® Cu-406 electroless plating solution (from Enthone) for a time and temperature sufficient to achieve a copper thickness of approximately 1.1 μm, followed by rinsing with water. A darkening agent was applied directly to the copper layer by immersing the electroless copper-plated pattern in a beaker containing a solution of palladium metal (supplied by Atotech) at 29° C. for 3 minutes to deposit a dark palladium layer.

The darkened metallic pattern side of the first substrate was brought into contact with a 0.80 mm thick poly(vinyl butyral) film as the second substrate (SAFLEX® RF41). A sheet of Kapton film was placed on the other side of the polyvinyl butyral film. The two substrates on the Kapton film were passed 18 in/min (45.7 cm/min) through a heated roller nip at 202° F. (~94° C.) and 1.7 psi (24.2 kgf/$cm^2$) nip pressure. After cooling, the first substrate was peeled away from the second substrate and the catalyst ink, copper pattern, and darkening agent remained with the polyvinyl butyral substrate, leaving an undarkened second surface of the metallic pattern exposed to view.

The second substrate with the catalyst ink, metallic pattern, and first darkening agent was immersed in a beaker containing a darkening agent solution comprising palladium metal (supplied by Atotech) for 3 minutes at 29° C. to produce a darkened surface of the exposed copper and catalyst ink.

A similarly treated sample was laminated between two sheets of glass passed through a heated roller nip at 202° F. (~94° C.) and 1.7 psi (24.2 kg/$cm^2$) nip pressure at 18 in/min (45.7 cm/min) to form a composite article including the presence of darkening agents.

The resistances of the metallic pattern at each step was measured using a linear 4 point probe and are reported as sheet resistance in TABLE I shown below.

The reflection color of each side of the metallic pattern was measured using a Hunter colorimeter with a light trap behind the sample to increase the sensitivity to the light reflected by the sample. The sample was measured in two orientations: first with the metallic pattern facing the light source and second with the substrate facing the light source. L*, a*, b*, C* values are reported below in TABLE I. The use of this instrument results in color measurements that are integrated over an area of the substrate defined by the measurement aperture, and over a hemisphere of reflectance angles. As discussed earlier, this will typically result in measured color differences that are diluted relative to those observed by a human viewer at near-specular viewing angles where the metallic appearance of the undarkened metallic patterns can be quite dramatic. Therefore, a relatively small measured color difference (for example, 1 L* unit) may correspond to a significant reduction in the visible metallic reflections.

The description of the results in the following TABLE I correspond to the parts identified in FIGS. 6B, 6C, 6D, 6E, and 6F, as indicated by the first column of TABLE I. Referring to FIG. 6B and FIG. 6C, application of the first darkening agent 510 of the invention to the exposed side of the metallic pattern 505 resulted in a more neutral appearing first darkened surface 511 of the metallic pattern, corresponding to a reduction in L* value of 6.25 units and a reduction in C* value of 6.84 units. However, when the metallic pattern 505 was viewed through the first substrate 500, there was still a shiny, coppery appearance due to the exposed copper surface on the either side of the catalyst ink. Following transfer of the metallic pattern 505 as shown in FIG. 6D, the undarkened surface 512 was treated with second darkening agent 525 resulting in second darkened surface 526, as shown in FIGS. 6E and 6F. The L* and C* values of the undarkened surface 512 were reduced by 1.10 and 0.97 units, respectively, resulting in a more neutral appearance of the metallic pattern 505, as viewed from the bottom of FIG. 6F. The metallic pattern 505 when viewed through the second substrate 520 at the top of FIG. 6F retained a neutral appearance.

Referring to measurements E1 and E2, the composite article laminated between two panes of glass was viewed from each side and each side was found to be neutral in appearance and similar in appearance. The composite article laminated between two panes of glass was measured on each side and the results are consistent with the observations of similarly neutral appearance.

TABLE I

| FIG. | Sample Description | Measurement | Side Facing Light Source | L* | a* | b* | C* | Sheet Resistance (ohms/ square) |
|---|---|---|---|---|---|---|---|---|
| | First Substrate (PET) | A0 | Surface 501 | 38.14 | 0.00 | 0.72 | 0.72 | |
| FIG. 6B | Metallic Pattern | A1 | Surface 501 | 44.21 | 5.19 | 6.15 | 8.05 | 0.22 |
| | (Copper Plated Catalyst Ink) | A2 | Second surface 502 | 40.21 | 1.09 | 2.04 | 2.31 | |
| FIG. 6C | Metallic Pattern w/First | B1 | Surface 501 | 37.96 | 0.01 | 1.21 | 1.21 | 0.28 |
| | Darkening Agent | B2 | Second surface 502 | 39.37 | 0.92 | 1.89 | 2.10 | |
| | | B1 − A1 | | −6.25 | −5.18 | −4.94 | −6.84 | |
| | Second Substrate (PVB) | C0 | Surface 521 | 33.60 | −0.29 | −0.09 | 0.30 | |
| FIG. 6E | Transferred Metallic | C1 | Surface 521 | 31.92 | 1.39 | 0.80 | 1.60 | |
| | Pattern | C2 | Second surface 522 | 32.56 | −0.24 | −0.12 | 0.27 | 0.36 |
| FIG. 6F | Transferred Metallic Pattern w/ | D1 | Surface 521 | 30.82 | 0.16 | −0.61 | 0.63 | |

TABLE I-continued

| FIG. | Sample Description | Measurement | Side Facing Light Source | L* | a* | b* | C* | Sheet Resistance (ohms/ square) |
|---|---|---|---|---|---|---|---|---|
| | Second Darkening Agent | D2 | Second surface 522 | 33.46 | −0.11 | 0.18 | 0.21 | 0.43 |
| | | D1 − C1 | | −1.10 | −1.23 | −1.41 | −0.97 | |
| | Second Substrate | E1 | Surface 521 | 33.39 | −0.25 | 0.53 | 0.58 | |
| | Laminated Between Glass | E2 | Second surface 522 | 34.18 | 0.09 | 0.42 | 0.43 | |
| | | E2 − E1 | | 0.79 | 0.34 | −0.11 | −0.15 | |

Example 2

Silver nanoparticles were prepared by mixing 2 kg of silver nitrate and 21 kg of DOWANOL™ PM solvent until a clear first solution is obtained. A second solution containing 69 g of ethyl cellulose, 26 g of ascorbic acid, and 13 kg of DOWANOL™ PM solvent was prepared and stirred for 30 minutes, followed by the addition of 2 kg of 2-methyl amino ethanol. The first solution was added slowly to the second solution, and the resulting mixture was stirred for 2 hours at 80° C. to produce silver nanoparticles in solution. The solution was decanted and filtered to produce a slurry of silver nanoparticles in DOWANOL™ PM solvent.

Ink Preparation:

A thermally curable catalyst ink composition was prepared comprising 68.6% of the silver particles prepared as above, 1.4% of BUTVAR® B-76 poly(vinyl butyral) available from Eastman Chemical Company (Kingsport, TN), 23.0% of DOWANOL™ DPM solvent and 7.0% of DOWANOL™ PM solvent.

A mask was written with a predetermined pattern using the KODAK EKTAFLEX Imager with Kodak Square Spot laser technology at a resolution of 12,800 dpi on a KODAK EKTAFLEX Thermal Imaging Layer. The mask was laminated to a commercially available 1.14 mm Kodak EKTAFLEX photopolymer plate precursor (Eastman Kodak Company). The flexographic plate precursor was exposed to UV energy sufficient to provide a cured relief image in the printing plate precursor. The mask was removed from the plate and the plate was processed (developed) using known conditions suggested for these relief printing members by the manufacturer. The flexographic plate was adhered to the printing form cylinder using 3M™ Cushion-Mount™ Plus Plate Mounting Tape E1120. The relief image design in the flexographic printing plates included an approximately 20 mm×20 mm solid unpatterned region.

A sample of the thermally curable ink composition was printed on MELINEX® ST506 polyester film (DuPont Teijin Films) using a benchtop test printer, "IGT F1 Printability Tester" (IGT Testing Systems Inc., Arlington Heights, IL) in the flexographic mode. The Anilox roller system that was used to apply the photocurable composition to flexographic printing plates had values of 6.6 BCMI and 140 lines/in (355.6 lines/cm) as specified by IGT. The printed patterns were made at ambient temperature using an Anilox force of 20N, a print force of 10N, and a print speed of 0.20 m/s. After printing, the printed substrate was dried at 120° C. for 5 minutes.

The first substrate with the dried catalyst pattern was electrolessly copper plated by immersing the substrate for 24 minutes at 35° C. in a beaker containing ENPLATE® Cu-406 electroless plating solution (Enthone), followed by rinsing with distilled water and air drying to an electrically conductive region. This article with the copper plated electrically-conductive region was immersed in a beaker containing a darkening agent solution comprising palladium metal (supplied by Atotech) for 5 minutes at room temperature (20° C.) to produce a darkened electrically-conductive pattern, and then air dried.

Following this, a piece of Scotch® 810 Magic Tape adhesive tape from 3M Corporation was applied to the electrolessly-plated region and then pulled off the surface of the first substrate, removing the electrically conductive pattern including the darkening agent, copper, and catalytic ink layers from the substrate surface. The copper was visible around the edges of the ink resulting in a somewhat shiny and coppery appearance when viewed from above the adhesive side of the tape. The tape with these layers was then immersed in the darkening agent bath for 5 minutes at room temperature. Following this step, the electrically conductive region was visibly dark when viewed through the tape substrate and was also dark when viewed from the side with the newly applied darkening agent. The electrically-conductive region measured less than 1 ohm/sq sheet resistance before and after the transfer and application of the second darkening agent.

Example 3

An electrically-conductive pattern was printed on 125 μm MELINEX® ST506 polyester film (from Du Pont Teijin Films) similar to that of Example 1 and included a grid pattern with 16 μm lines spaced 320 μm apart and a grid pattern of 10 μm fine lines spaced 62 μm apart. Three curing conditions were used to create three separate samples by varying the UV dosage applied at the same print station in which the pattern was printed, and also the next two print stations where no printing was done, but the UV curing was available. The temperature of the substrate during UV exposure was controlled by changing the water temperature of the impression roll, as shown below in TABLE II. These samples were electrolessly plated with copper and a darkening agent was applied to the copper pattern. Adhesion was tested for each sample by applying a piece of Scotch® 810 Magic Tape adhesive tape from 3M™ Corporation to the electrolessly-plated region and then pulled off the surface of the first substrate. As can be seen from TABLE II below, UV curing conditions can be varied to affect the degree of adhesion of the pattern and whether the pattern can be removed at the copper-ink interface or at the ink-substrate interface. By varying these conditions, the subsequent transfer and darkening steps of the invention can be readily practiced.

TABLE II

| Example | First UV Dosage (mJ/cm$^2$) | Second UV Dosage (mJ/cm$^2$) | Third UV Dosage (mJ/cm$^2$) | Chiller Setpoint | Adhesion |
|---|---|---|---|---|---|
| 3-1 | 400 | — | — | 75° F. (24° C.) | No removal |
| 3-2 | 400 | 400 | 400 | 75° F. (24° C.) | Removal at Cu-ink interface |
| 3-3 | 100 | 100 | 400 | 60° F. (16° C.) | Removal at ink-PET interface |

PARTS LIST

100 flexographic printing system
102 supply roll
104 take-up roll
105 roll-to-roll direction
106 roller
107 roller
110 print module
111 plate cylinder
112 flexographic printing plate
113 raised features
114 impression cylinder
115 anilox roller
116 UV curing station
120 print module
121 plate cylinder
122 flexographic printing plate
124 impression cylinder
125 anilox roller
126 UV curing station
130 print module
131 plate cylinder
132 flexographic printing plate
134 impression cylinder
135 anilox roller
136 UV curing station
140 print module
141 plate cylinder
142 flexographic printing plate
144 impression cylinder
145 anilox roller
146 UV curing station
150 substrate
151 first surface
152 second surface
200 roll-to-roll electroless plating system
202 supply roll
204 take-up roll
205 in-track direction
206 drive roller
207 drive roller
208 web-guiding roller
210 aqueous plating solution
215 replenished aqueous plating solution
220 reservoir
230 tank
232 drainpipe
234 return pipe
236 filter
240 pump
242 controller
400 provide catalytic ink pattern on first substrate step
402 cure catalytic ink pattern step
405 form metallic pattern on cured catalytic ink pattern step
410 provide metallic pattern on first substrate step
415 provide first darkening agent to first surface of metallic pattern step
420 transfer metallic pattern to second substrate step
425 apply second darkening agent to second surface of metallic pattern step
500 first substrate
501 surface
502 second surface
505 metallic pattern
510 first darkening agent
511 first darkened surface
512 undarkened surface
520 second substrate
521 surface
522 second surface
525 second darkening agent
526 second darkened surface
530 catalytic ink pattern
540 glass pane
542 glass pane
550 composite article
555 composite article
560 adhesive layer
700 automobile
704 composite antenna
705 windshield
708 composite antenna
710 tinted region
715 rear window
800 building
810 window
920 helmet
930 visor

The invention claimed is:

1. A method for providing an article comprising an electrically-conductive metal-containing pattern, the method comprising steps A) and B'), in order:

A) providing an electrically-conductive metal-containing pattern on a surface of a first substrate film that is comprised of polyethylene terephthalate, polyethylene naphthalate, a mixture of polyethylene terephthalate and polyethylene naphthalate, or a laminate comprising a polyethylene terephthalate film and a polyethylene naphthalate film; and B') transferring substantially all of the electrically-conductive metal-containing pattern to a surface of a second substrate that is a transparent laminating film consisting essentially of poly(vinyl butyral), by providing the first substrate comprising the electrically-conductive metal-containing pattern in direct contact with the surface of the second substrate, under heat, pressure, or heat and pressure, and removing the first substrate from the surface of the second substrate, thereby providing the electrically-conductive metal-containing pattern on the surface of the second substrate.

2. The method of claim 1, wherein the electrically-conductive metal-containing pattern comprises a plurality of features that can be spaced apart or connected.

3. The method of claim 1, wherein the electrically-conductive metal-containing pattern comprises copper, gold, aluminum, silver, or platinum, or a combination of two or more of these metals.

4. The method of claim 1, wherein the transparent laminating film is in the form of a continuous poly(vinyl butyral) web.

5. The method of claim 1, comprising providing two or more electrically-conductive metal-containing patterns on the second substrate of the article, comprising:

providing two or more of the same or different electrically-conductive metal-containing patterns on the surface of the first substrate; and transferring substantially all of the two or more of the same or different electrically-conductive metal-containing patterns in direct contact with and to the surface of the second substrate, under heat, pressure, or heat and pressure, and removing the first substrate from the surface of the second substrate, thereby providing two or more of the same or different electrically-conductive metal-containing patterns on the surface of the second substrate, wherein the second substrate is in the form of a continuous poly(vinyl butyral) web.

6. The method of claim 5, wherein the article comprising two ore more electrically-conductive metal-containing patterns directly on the surface of the second substrate, has an optical transparency of at least 80%.

7. The method of claim 5, wherein the article further comprises a pattern of a catalytic ink disposed between each of the two or more electrically-conductive metal-containing patterns and the surface of the second substrate.

8. The method of claim 7, wherein the pattern of catalytic ink disposed between each of the two or more electrically-conductive metal-containing patterns comprises silver nanoparticles, and each of the two more electrically-conductive metal-containing patterns comprises at least copper metal.

9. The method of claim 1, wherein the article comprising the electrically-conductive metal-containing pattern has an optical transparency of at least 80%.

10. The method of claim 1, wherein the article comprising the electrically-conductive metal-containing pattern further comprises a pattern of a catalytic ink disposed between the electrically-conductive metal-containing pattern and the surface of the second substrate.

11. The method of claim 10, wherein the catalytic ink pattern comprises silver nanoparticles and the electrically-conductive metal-containing pattern comprises at least copper metal.

12. The method of claim 10, wherein the catalytic ink pattern is disposed on the surface of the first substrate using flexographic printing before the electrically-conductive metal-containing pattern is provided on the surface of the first substrate.

13. The method of claim 1, further comprising providing a first darkening agent on the electrically-conductive metal-containing pattern on the surface of the first substrate, before the electrically-conductive metal-containing pattern is transferred directly to the surface of the second substrate in step B').

14. The method of claim 13, wherein the first darkening agent comprises palladium metal or nickel metal.

* * * * *